US012711914B2

(12) United States Patent
Xiao et al.

(10) Patent No.: US 12,711,914 B2
(45) Date of Patent: Aug. 18, 2026

(54) PIXEL DRIVING CIRCUIT AND DRIVING METHOD THEREFOR, DISPLAY PANEL, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yunsheng Xiao, Beijing (CN); Haigang Qing, Beijing (CN); Zhongliu Yang, Beijing (CN); Zhiliang Jiang, Beijing (CN); Ming Hu, Beijing (CN); Miao Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 292 days.

(21) Appl. No.: 18/705,682

(22) PCT Filed: Oct. 29, 2021

(86) PCT No.: PCT/CN2021/127467
§ 371 (c)(1),
(2) Date: Apr. 29, 2024

(87) PCT Pub. No.: WO2023/070530
PCT Pub. Date: May 4, 2023

(65) Prior Publication Data

US 2026/0162602 A1 Jun. 11, 2026

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ...... G09G 3/3233; G09G 3/3266; G09G 3/32; G09G 3/3291; G09G 3/3258;
(Continued)

(56) References Cited

U.S. PATENT DOCUMENTS 10,004,124 B1 6/2018 Ko et al.
2015/0262526 A1 9/2015 Park et al.
(Continued)

FOREIGN PATENT DOCUMENTS

CN 107358918 A 11/2017
CN 107610651 A 1/2018
(Continued)

OTHER PUBLICATIONS

International Search Report of PCT application No. PCT/CN2021/127467 dated Jul. 5, 2022.
(Continued)

*Primary Examiner* — Dong Hui Liang
(74) *Attorney, Agent, or Firm* — Calfee, Halter & Griswold LLP

(57) ABSTRACT

A pixel driving circuit and a driving method therefor, and a display panel. The pixel driving circuit is used for driving a light-emitting unit. The pixel driving circuit includes: a driving circuit, a compensation circuit, a control circuit and a data writing circuit. The driving circuit is connected to a first node, a second node and a third node, and is used for inputting a driving current to the third node by means of the second node according to a voltage signal of the first node. The compensation circuit is connected to the first node, the third node and a gate driving signal end, and is used for
(Continued)

connecting the first node and the third node in response to a signal of the gate driving signal end.

20 Claims, 14 Drawing Sheets

(52) U.S. Cl.
CPC ............... *G09G 2300/0819* (2013.01); *G09G 2300/0842* (2013.01); *G09G 2300/0861* (2013.01); *G09G 2310/08* (2013.01); *G09G 2320/0247* (2013.01)

(58) Field of Classification Search
CPC .. G09G 3/3225; G09G 3/3208; G09G 3/3275; G09G 3/20; G09G 2300/0819; G09G 2300/0842; G09G 2300/0861; G09G 2300/0426; G09G 2300/0852; G09G 2320/0233; G09G 2320/043; G09G 2320/045; G09G 2320/0295; G09G 2310/08; G09G 2310/0251; G09G 2310/0262; G09G 2330/021
See application file for complete search history.

(56) References Cited

U.S. PATENT DOCUMENTS

| | | | | |
|---|---|---|---|---|
| 2019/0237018 | A1* | 8/2019 | Kim | G09G 3/3233 |
| 2021/0125543 | A1 | 4/2021 | Kim et al. | |
| 2021/0125562 | A1* | 4/2021 | Li | G09G 3/3258 |
| 2021/0407419 | A1* | 12/2021 | Li | G09G 3/3258 |
| 2023/0165069 | A1* | 5/2023 | Liu | H10K 59/1213 345/690 |
| 2025/0140163 | A1* | 5/2025 | Zhang | G09G 3/32 |

FOREIGN PATENT DOCUMENTS

| | | | |
|---|---|---|---|
| CN | 107863061 | A | 3/2018 |
| CN | 107886912 | A | 4/2018 |
| CN | 109064973 | A | 12/2018 |
| CN | 110176213 | A | 8/2019 |
| CN | 110265458 | A | 9/2019 |
| CN | 110491338 | A | 11/2019 |
| CN | 111261082 | A | 6/2020 |
| CN | 111477179 | A | 7/2020 |
| CN | 111710299 | A | 9/2020 |
| CN | 111739905 | A | 10/2020 |
| CN | 111968574 | A | 11/2020 |
| CN | 111968576 | A | 11/2020 |
| CN | 112086062 | A | 12/2020 |
| CN | 112133253 | A | 12/2020 |
| CN | 112470286 | A | 3/2021 |
| CN | 112634832 | A | 4/2021 |
| CN | 113012643 | A | 6/2021 |
| CN | 113224123 | A | 8/2021 |
| CN | 113892132 | A | 1/2022 |
| CN | 117337099 | A | 1/2024 |
| TW | 201610525 | A | 3/2016 |
| WO | 2024178673 | A1 | 9/2024 |
| WO | 2025066749 | A1 | 4/2025 |

OTHER PUBLICATIONS

Written Opinion of PCT application No. PCT/CN2021/127467 dated Jul. 5, 2022.
First Office Action of CN application No. 202180003165.2 dated May 19, 2025.
Second Office Action of CN application No. 202180003165.2 dated Sep. 22, 2025.

* cited by examiner t1 t2 t3 t4

Re

Gate

EM1

EM2

Da

T1 T2

PIXEL DRIVING CIRCUIT AND DRIVING METHOD THEREFOR, DISPLAY PANEL, AND DISPLAY DEVICE

CROSS-REFERENCE TO RELATED APPLICATIONS

The present application is a U.S. National Stage of International Application No. PCT/CN2021/127467, filed on Oct. 29, 2021, the entire disclosure of which is incorporated herein by reference for all purposes.

TECHNICAL FIELD

The disclosure relates to the technical field of display, in particular to a pixel driving circuit and a driving method thereof, a display panel and a display device.

BACKGROUND

In the related art, the characteristic curve of the driving transistor in the pixel driving circuit will drift under the long-term bias voltage, thus affecting its driving effect.

It should be noted that the information disclosed in the above background section is only used to enhance understanding of the background of the present disclosure, and therefore may include information that does not constitute related art known to those of ordinary skill in the art.

SUMMARY

According to an aspect of the present disclosure, there is provided a pixel driving circuit, for driving a light-emitting unit, including: a driving circuit, connected to a first node, a second node and a third node, configured to input a driving current to the third node through the second node according to a voltage signal of the first node; a compensation circuit, connected to the first node, the third node and a gate driving signal terminal, configured to connect the first node and the third node in response to a signal of the gate driving signal terminal; a control circuit, connected to the second node, a first power supply terminal, the third node, a first electrode of the light-emitting unit, and a first enable signal terminal, configured to connect the first power supply terminal and the second node in response to a signal of the first enable signal terminal, and configured to connect the third node and the first electrode of the light-emitting unit in response to the signal of the first enable signal terminal; and a data writing circuit, connected to the second node, a data signal terminal and a second enable signal terminal, configured to transmit a signal of the data signal terminal to the second node in response to a signal of the second enable signal terminal. During at least part of a period when the gate driving signal terminal outputs an invalid level, the first enable signal terminal alternately outputs a valid level and an invalid level, the second enable signal terminal alternately outputs a valid level and an invalid level, and a valid level period of the second enable signal terminal is within an invalid level period of the first enable signal terminal, and a valid level period of the first enable signal terminal is within an invalid level period of the second enable signal terminal.

In an example embodiment of the present disclosure, the driving circuit includes: a driving transistor, having a first electrode connected to the second node, a second electrode connected to the third node, and a gate connected to the first node.

In an example embodiment of the present disclosure, the compensation circuit includes: a second transistor, having a first electrode connected to the first node, a second electrode connected to the third node, and a gate connected to the gate driving signal terminal.

In an example embodiment of the present disclosure, the data writing circuit includes: a fourth transistor, having a first electrode connected to the data signal terminal, a second electrode connected to the second node, and a gate connected to the second enable signal terminal.

In an example embodiment of the present disclosure, the control circuit includes: a fifth transistor, having a first electrode connected to the first power supply terminal, a second electrode connected to the second node, and a gate connected to the first enable signal terminal; a sixth transistor, having a first electrode connected to the third node, a second electrode connected to the first electrode of the light-emitting unit, and a gate connected to the first enable signal terminal.

In an example embodiment of the present disclosure, logic levels of the second enable signal terminal and the first enable signal terminal are opposite.

In an example embodiment of the present disclosure, the pixel driving circuit further includes: a first reset circuit, connected to the first node, a first initial signal terminal and a reset signal terminal, configured to transmit a signal of the first initial signal terminal to the first node in response to a signal of the reset signal terminal; a second reset circuit, connected to the first electrode of the light-emitting unit and a second initial signal terminal, configured to transmit a signal of the second initial signal terminal to the first electrode of the light-emitting unit in response to a control signal.

In an example embodiment of the present disclosure, the second reset circuit is further connected to the second enable signal terminal, and the second reset circuit is configured to transmit the signal of the second initial signal terminal to the first electrode of the light-emitting unit in response to the signal of the second enable signal terminal.

In an example embodiment of the present disclosure, the first reset circuit includes: a first transistor, having a first electrode connected to the first initial signal terminal, a second electrode connected to the first node, and a gate connected to the reset signal terminal; wherein the second reset circuit includes: a seventh transistor, having a first electrode connected to the second initial signal terminal, a second electrode connected to the first electrode of the light-emitting unit, and a gate connected to the second enable signal terminal.

In an example embodiment of the present disclosure, the pixel driving circuit further includes: a storage circuit, connected between the first node and the first power supply terminal.

In an example embodiment of the present disclosure, the storage circuit includes: a capacitor, connected between the first node and the first power supply terminal.

In an example embodiment of the present disclosure, the driving circuit includes: a driving transistor, having a first electrode connected to the second node, a second electrode connected to the third node, and a gate connected to the first node; wherein the compensation circuit includes: a second transistor, having a first electrode connected to the first node, a second electrode connected to the third node, and a gate connected to the gate driving signal terminal; wherein the data writing circuit includes: a fourth transistor, having a first electrode connected to the data signal terminal, a second electrode connected to the second node, and a gate connected to the second enable signal terminal; wherein the control circuit includes: a fifth transistor, having a first electrode connected to the first power supply terminal, a second electrode connected to the second node, and a gate connected to the first enable signal terminal; a sixth transistor, having a first electrode connected to the third node, a second electrode connected to the first electrode of the light-emitting unit, and a gate connected to the first enable signal terminal; wherein the pixel driving circuit further includes a first reset circuit, a second reset circuit and a storage circuit; wherein the first reset circuit includes: a first transistor, having a first electrode connected to a first initial signal terminal, a second electrode connected to the first node, and a gate connected to a reset signal terminal; wherein the second reset circuit includes: a seventh transistor, having a first electrode connected to a second initial signal terminal, a second electrode connected to the first electrode of the light-emitting unit, and a gate connected to the second enable signal terminal; wherein the storage circuit includes: a capacitor, connected between the first node and the first power supply terminal; wherein, the driving transistor, the first transistor, the second transistor, the fourth transistor, the fifth transistor, the sixth transistor and the seventh transistor are P-type transistors.

According to an aspect of the present disclosure, there is provided a driving method of a pixel driving circuit, for driving the pixel driving circuit described above, the driving method includes:

- in a first sub-stage of a first stage, the gate driving signal terminal and the second enable signal terminal outputting a valid level, and the first enable signal terminal outputting an invalid level;
- in a second sub-stage of the first stage, the first enable signal terminal outputting a valid level, and the second enable signal terminal and the gate driving signal terminal outputting an invalid level;
- in a second stage, the gate driving signal terminal outputting an invalid level, the first enable signal terminal alternately outputting a valid level and an invalid level, and the second enable signal terminal alternately outputting a valid level and an invalid level,
- wherein, a valid level period of the second enable signal terminal is within an invalid level period of the first enable signal terminal, and a valid level period of the first enable signal terminal is within an invalid level period of the second enable signal terminal, and in the second stage, a level written to the second node by the data signal terminal is at least partially different from a voltage of the first power supply terminal.

In an example embodiment of the present disclosure, the pixel driving circuit is applied to a display panel, and one frame period of the display panel includes a picture updating period and a picture holding period; in one frame period, first stages of all pixel driving circuits in the display panel are within the picture updating period, and second stages of all pixel driving circuits in the display panel are within the picture holding period.

According to an aspect of the present disclosure, there is provided a display panel, including the pixel driving circuit described above.

According to an aspect of the present disclosure, there is provided a display panel, including a pixel driving circuit for driving a light-emitting unit, the pixel driving circuit including: a driving transistor; a second transistor, having a first electrode connected to a gate of the driving transistor, a second electrode connected to a second electrode of the driving transistor, and a gate connected to a gate line; a fourth transistor, having a first electrode connected to a data line, a second electrode connected to a first electrode of the driving transistor, and a gate connected to a second enable signal line; a fifth transistor, having a first electrode connected to a power supply line, a second electrode connected to the first electrode of the driving transistor, and a gate connected to a first enable signal line; a sixth transistor, having a first electrode connected to the second electrode of the driving transistor, a second electrode connected to a first electrode of the light-emitting unit, and a gate connected to the first enable signal line. The display panel further includes: a base substrate; an active layer, located on a side of the base substrate, wherein the active layer includes a second active part, a third active part, a fourth active part, a fifth active part and a sixth active part, the second active part is configured to form a channel region of the second transistor, the third active part is configured to form a channel region of the driving transistor, the fourth active part is configured to form a channel region of the fourth transistor, the fifth active part is configured to form a channel region of the fifth transistor, and the sixth active part is configured to form a channel region of the sixth transistor; a first conductive layer, located on a side of the active layer away from the base substrate, wherein the first conductive layer includes the first enable signal line, the second enable signal line, the gate line and a first conductive part, wherein an orthographic projection of the first conductive part on the base substrate covers an orthographic projection of the third active part on the base substrate, and the first conductive part is configured to form the gate of the driving transistor; wherein an orthographic projection of the first enable signal line on the base substrate extends along a first direction and covers an orthographic projection of the fifth active part on the base substrate and an orthographic projection of the sixth active part on the base substrate, and a partial structure of the first enable signal line is configured to form the gate of the fifth transistor and the gate of the sixth transistor; wherein an orthographic projection of the second enable signal line on the base substrate extends along the first direction and covers an orthographic projection of the fourth active part on the base substrate, and a partial structure of the second enable signal line is configured to form the gate of the fourth transistor; wherein an orthographic projection of the gate line on the base substrate extends along the first direction and covers an orthographic projection of the second active part on the base substrate, and a partial structure of the gate line is configured to form the gate of the second transistor.

In an example embodiment of the present disclosure, the orthographic projection of the first enable signal line on the base substrate is located between the orthographic projection of the second enable signal line on the base substrate and the orthographic projection of the first conductive part on the base substrate. The active layer further includes: an eighth active part, connected between the third active part and the fifth active part; a ninth active part, connected to the fourth active part, wherein an orthographic projection of the ninth active part on the base substrate is located between the orthographic projection of the first enable signal line on the base substrate and the orthographic projection of the second enable signal line on the base substrate. The display panel further includes: a third conductive layer, located on a side of the first conductive layer away from the base substrate, wherein the third conductive layer includes a first connection part, and the first connection part connects the eighth active part and the ninth active part through a via hole respectively.

In an example embodiment of the present disclosure, the pixel driving circuit further includes: a capacitor, connected between that power supply line and the gate of the driving transistor; a first transistor, having a first electrode connected to a first initial signal line, a second electrode connected to the gate of the driving transistor, and a gate connected to a reset signal line; a seventh transistor, having a first electrode connected to a second initial signal line, a second electrode connected to the first electrode of the light-emitting unit, and a gate connected to the second enable signal line. The driving transistor, the first transistor, the second transistor, the fourth transistor, the fifth transistor, the sixth transistor and the seventh transistor are P-type transistors. The active layer further includes a first active part and a seventh active part, the first active part is configured to form a channel region of the first transistor, and the seventh active part is configured to form a channel region of the seventh transistor; wherein the first conductive layer further includes a reset signal line, an orthographic projection of the reset signal line on the base substrate extends along the first direction, the orthographic projection of the reset signal line on the base substrate covers an orthographic projection of the first active part on the base substrate, and a partial structure of the reset signal line is configured to form the gate of the first transistor; wherein the orthographic projection of the second enable signal line on the base substrate further covers the seventh active part, and a partial structure of the second enable signal line is configured to form the gate of the seventh transistor; wherein the display panel further includes a second conductive layer, the second conductive layer is located on a side of the first conductive layer away from the base substrate, and the second conductive layer includes: a second conductive part, wherein an orthographic projection of the second conductive part on the base substrate at least partially overlaps with the orthographic projection of the first conductive part on the base substrate, the first conductive part is further configured to form a first electrode of the capacitor, and the second conductive part is further configured to form a second electrode of the capacitor; wherein the orthographic projection of the gate line on the base substrate is located on a side of the orthographic projection of the first conductive part on the base substrate away from the orthographic projection of the first enable signal line on the base substrate; wherein the orthographic projection of the reset signal line on the base substrate is located on a side of the orthographic projection of the gate line on the base substrate away from the orthographic projection of the first conductive part on the base substrate.

In an example embodiment of the present disclosure, the active layer further includes a tenth active part and an eleventh active part, the tenth active part is connected to an end of the first active part away from the second active part, and the eleventh active part is connected to an end of the seventh active part away from the sixth active part. The second conductive layer further includes: the first initial signal line, wherein an orthographic projection of the first initial signal line on the base substrate extends along the first direction, and the orthographic projection of the first initial signal line on the base substrate is located on a side of the orthographic projection of the reset signal line on the base substrate away from the orthographic projection of the first conductive part on the base substrate; the second initial signal line, wherein an orthographic projection of the second initial signal line on the base substrate extends along the first direction, and the orthographic projection of the second initial signal line on the base substrate is located on a side of the orthographic projection of the second enable signal line on the base substrate away from the orthographic projection of the first conductive part on the base substrate. The display panel further includes a third conductive layer, the third conductive layer is located on a side of the second conductive layer away from the base substrate, and the third conductive layer includes: a second connection part, connecting the tenth active part and the first initial signal line through a via hole respectively; a third connection part, connecting the second initial signal line and the eleventh active part through a via hole respectively.

In an example embodiment of the present disclosure, the first direction is a row direction, and the display panel includes a plurality of rows of pixel driving circuits, and an orthographic projection of the second initial signal line in the pixel driving circuit of a current row on the base substrate is located between an orthographic projection of the reset signal line in the pixel driving circuit of an adjacent next row on the base substrate and an orthographic projection of the gate line on the base substrate.

In an example embodiment of the present disclosure, the first active part includes a first active sub-part and a second active sub-part, and the active layer further includes a third active sub-part connected between the first active sub-part and the second active sub-part; an orthographic projection of the first initial signal line on the base substrate at least partially overlaps with an orthographic projection of the third active sub-part on the base substrate.

In an example embodiment of the present disclosure, the second active part includes a fourth active sub-part and a fifth active sub-part, and the active layer further includes a sixth active sub-part connected between the fourth active sub-part and the fifth active sub-part. The second initial signal line includes: a main body line, wherein an orthogonal projection of the main body line on the base substrate extends along the first direction; a first protrusion part, connected to the main body line, wherein an orthographic projection of the first protrusion part on the base substrate extends along a second direction, and the second direction intersects with the first direction; wherein, an orthographic projection of the first protrusion part in the pixel driving circuit of a previous row on the base substrate at least partially overlaps with an orthographic projection of the sixth active sub-part in the pixel driving circuit of a current row on the base substrate.

In an example embodiment of the present disclosure, the active layer further includes a twelfth active part connected between the first active part and the second active part. The second initial signal line includes: a main body line, wherein an orthogonal projection of the main body line on the base substrate extends along the first direction; a second protrusion part, connected to the main body line, and an orthographic projection of the second protrusion part on the base substrate extends along a second direction, and the second direction intersects with the first direction, wherein, an orthographic projection of the second protrusion part in the pixel driving circuit of a previous row on the base substrate at least partially overlaps with an orthographic projection of the twelfth active part in the pixel driving circuit of a current row on the base substrate.

In an example embodiment of the present disclosure, the second initial signal line further includes: a third protrusion part, connected to the main body line, wherein an orthographic projection of the third protrusion part on the base substrate extends along the second direction, and the orthographic projection of the third protrusion part on the base substrate is located on a side of the orthographic projection of the main body line on the base substrate away from the orthographic projection of the second protrusion part on the base substrate; wherein, an orthographic projection of the third protrusion part in the pixel driving circuit of a previous row on the base substrate at least partially overlaps with an orthographic projection of the twelfth active part in the pixel driving circuit of a current row on the base substrate.

According to an aspect of the present disclosure, there is provided a display device, including the display panel described above.

It should be understood that the above general description and the following detailed description are only exemplary and explanatory and do not limit the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. The drawings in the following description are only some embodiments of the present disclosure, and those skilled in the art can obtain other drawings according to these drawings without creative efforts.

DETAILED DESCRIPTION

Figures 1, 2:
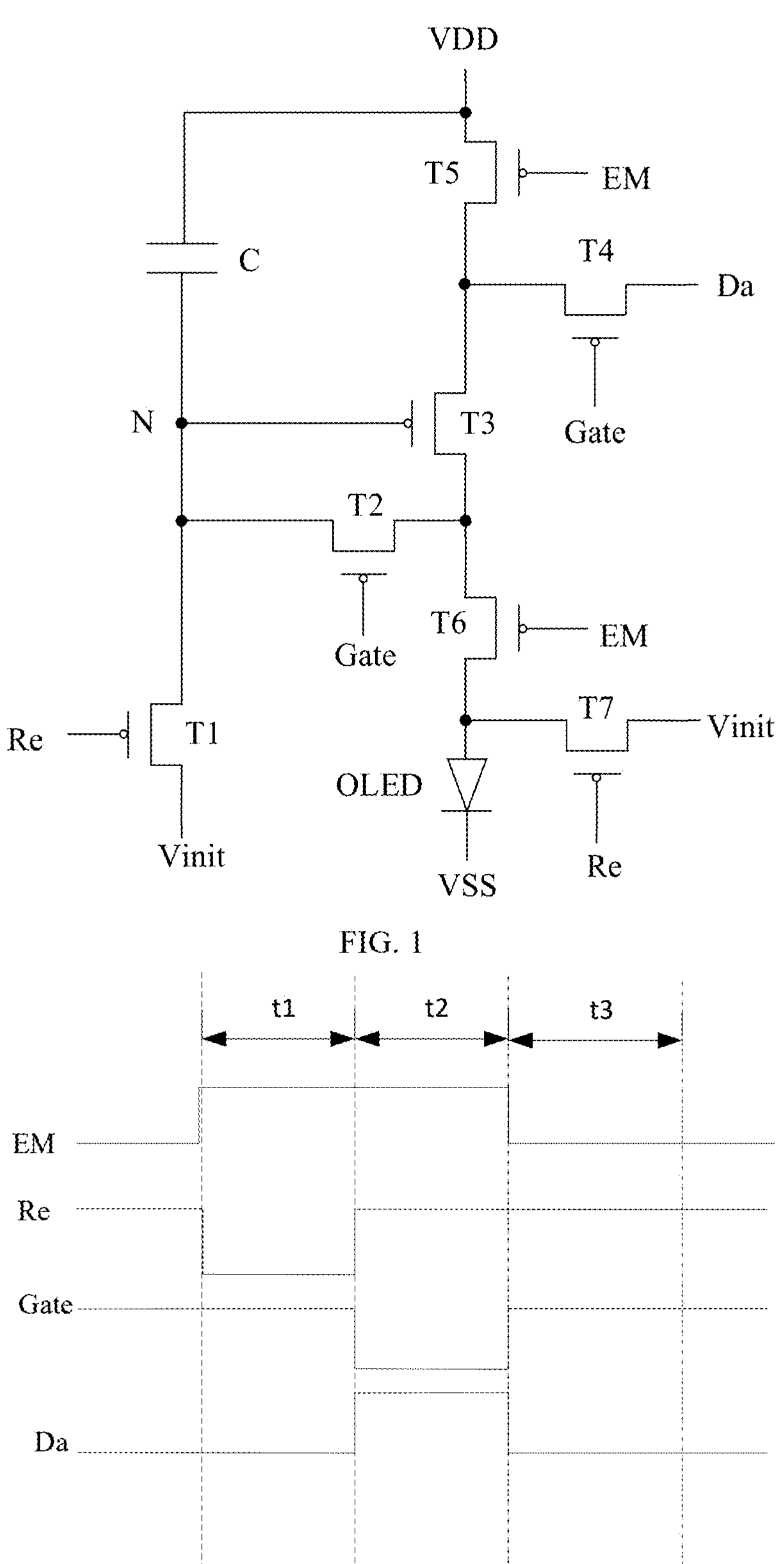
FIG. 1 is a schematic circuit structure diagram of a pixel driving circuit in the related art.
FIG. 2 is a timing diagram of each node in a driving method of the pixel driving circuit in FIG. 1.

Example embodiments will now be described more fully with reference to the accompanying drawings. Example embodiments may, however, be embodied in various forms and should not be construed as limited to the embodiments set forth herein; rather, these embodiments are provided so that this disclosure will be thorough and complete and will fully convey the concepts of the example embodiments to those skilled in the art. The same reference numerals in the drawings indicate the same or similar structures, and thus their detailed descriptions will be omitted.

The terms “a”, “an” and “the” are used to indicate the presence of one or more elements/components/etc.; the terms “including” and “having” are used to indicate an open-ended inclusive meaning and means that in addition to the listed elements/components/etc., there may be additional elements/components/etc.

FIG. 1 is a schematic circuit structure diagram of a pixel driving circuit in the related art. The pixel driving circuit may include a first transistor T1, a second transistor T2, a driving transistor T3, a fourth transistor T4, a fifth transistor T5, a sixth transistor T6, a seventh transistor T7, and a capacitor C. The first electrode of the first transistor T1 is connected to the initial signal terminal Vinit, the second electrode of the first transistor T1 is connected to the node N, and the gate of the first transistor T1 is connected to the reset signal terminal Re. The second electrode of the second transistor T2 is connected to the second electrode of the driving transistor T3, the first electrode of the second transistor T2 is connected to the node N, and the gate of the second transistor T2 is connected to the gate driving signal terminal Gate. The gate of the driving transistor T3 is connected to the node N. The first electrode of the fourth transistor T4 is connected to the data signal terminal Da, the second electrode of the fourth transistor T4 is connected to the first electrode of the driving transistor T3, and the gate of the fourth transistor T4 is connected to the gate driving signal terminal Gate. The first electrode of the fifth transistor T5 is connected to the first power supply terminal VDD, the second electrode of the fifth transistor T5 is connected to the first electrode of the driving transistor T3, and the gate of the fifth transistor T5 is connected to the enable signal terminal EM. The first electrode of the sixth transistor T6 is connected to the second electrode of the driving transistor T3, and the gate of the sixth transistor T6 is connected to the enable signal terminal EM. The first electrode of the seventh transistor T7 is connected to the initial signal terminal Vinit, the second electrode of the seventh transistor T7 is connected to the second electrode of the sixth transistor T6, and the gate of the seventh transistor T7 is connected to the reset signal terminal Re. The capacitor C is connected between the gate of the driving transistor T3 and the first power supply terminal VDD. The pixel driving circuit can be connected to a light-emitting unit OLED. The pixel driving circuit can be used to drive the light-emitting unit OLED to emit light, and the light-emitting unit OLED can be connected between the second electrode of the sixth transistor T6 and the second power supply terminal VSS. The driving transistor, the first transistor, the second transistor, the fourth transistor, the fifth transistor, the sixth transistor and the seventh transistor can be P-type transistors.

FIG. 2 is a timing diagram of each node in a driving method of the pixel driving circuit in FIG. 1. The Gate represents the timing of the gate driving signal terminal Gate, Re represents the timing of the reset signal terminal Re, EM represents the timing of the enable signal terminal EM, and Da represents the timing of the data signal terminal Da. The driving method of the pixel driving circuit may include a reset stage t1, a compensation stage t2, and a light-emitting stage t3. In the reset stage t1, the reset signal terminal Re outputs a low-level signal, the first transistor T1 and the seventh transistor T7 are turned on, and the initial signal terminal Vinit inputs an initial signal to the node N and the second electrode of the sixth transistor T6. In the compensation stage t2, the gate driving signal terminal Gate outputs a low-level signal, and the fourth transistor T4 and the second transistor T2 are turned on, meanwhile, the data signal terminal Da outputs a data signal to write the voltage Vdata+Vth to the node N, where Vdata is the voltage of the data signal, and Vth is the threshold voltage of the driving transistor T3. In the light-emitting stage t3, the enable signal terminal EM outputs a low-level signal, the sixth transistor T6 and the fifth transistor T5 are turned on, and the driving transistor T3 outputs a driving current to the light-emitting unit OLED under the action of the voltage Vdata+Vth stored in the capacitor C. According to the output current formula of the driving transistor $I=(\mu WCox/2L)\ (Vgs-Vth)^2$, where μ is the carrier mobility; Cox is the gate capacitance per unit area, W is the width of the driving transistor channel, L is the length of the driving transistor channel, Vgs is the gate-source voltage difference of the driving transistor, and Vth is the threshold voltage of the driving transistor, the output current of the driving transistor in the pixel driving circuit of the present disclosure is $I=(\mu WCox/2L)(Vdata+Vth-Vdd-Vth)^2$. The pixel driving circuit can avoid the influence of the threshold of the driving transistor on its output current.

Figure 3:
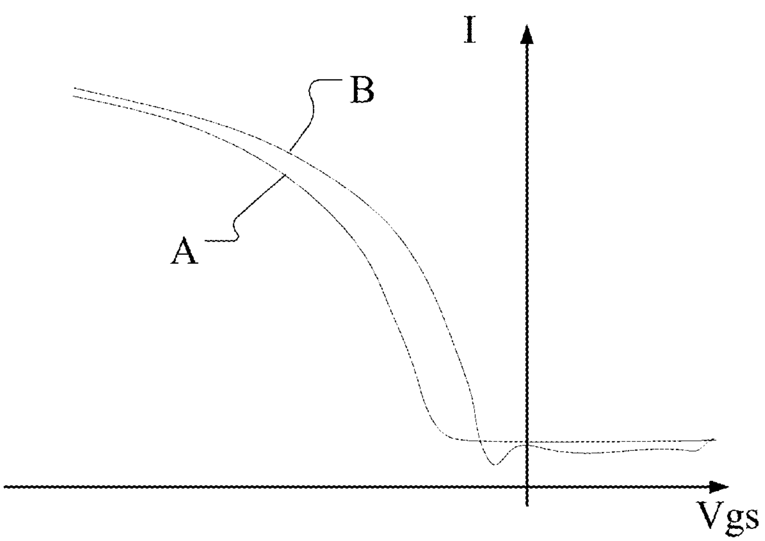
FIG. 3 is a diagram showing the change of the characteristic curve of the driving transistor under the hysteresis effect.

However, due to the hysteresis effect of the driving transistor T3, that is, when the driving transistor is kept at a constant bias voltage (Vgs) for a long time period, the characteristic curve of the driving transistor will drift. FIG. 3 is a diagram showing the change of the characteristic curve of the driving transistor under the hysteresis effect. The vertical axis I is the output current of the driving transistor, and the horizontal axis Vgs is the gate-source voltage difference of the driving transistor. The curve B is the original characteristic curve of the transistor, and curve A is the characteristic curve after the drift. According to FIG. 3, it can be seen that under the same bias voltage, the drift of the characteristic curve will lead to the decrease of the output current of the driving transistor, which will lead to the decrease of the brightness of the light-emitting unit. Especially when the refresh frequency of the display panel is low, due to the long time of one frame, the driving transistor maintains operation for a long time period under the bias voltage, so that the brightness of the light-emitting unit is seriously reduced, which causes the flicker phenomenon of the display panel.

Figure 4:
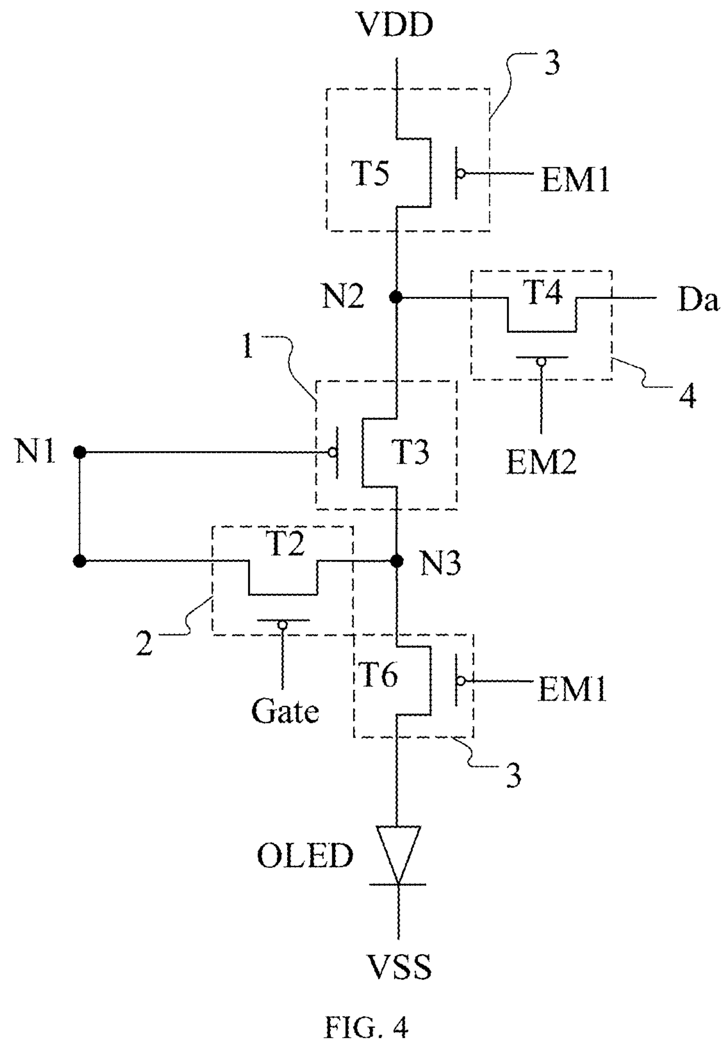
FIG. 4 is a schematic structural diagram of a pixel driving circuit of an example embodiment of the present disclosure.

Based on this, this example embodiment provides a pixel driving circuit, as shown in FIG. 4, which is a structural schematic diagram of the pixel driving circuit of an example embodiment of the present disclosure. The pixel driving circuit may include a driving circuit 1, a compensation circuit 2, a control circuit 3 and a data writing circuit 4. The driving circuit 1 is connected to a first node N1, a second node N2 and a third node N3, and configured to input a driving current to the third node N3 through the second node N2 according to a voltage signal of the first node N1. The compensation circuit 2 is connected to the first node N1, the third node N3 and a gate driving signal terminal Gate, and configured to connect the first node N1 and the third node N3 in response to a signal of the gate driving signal terminal Gate. The control circuit 3 is connected to the second node N2, a first power supply terminal VDD, the third node N3, a first electrode of the light-emitting unit, and a first enable signal terminal EM1, and configured to connect the first power supply terminal VDD and the second node N2 in response to a signal of the first enable signal terminal EM1, and configured to connect the third node N3 and the first electrode of the light-emitting unit in response to the signal of the first enable signal terminal EM1. The data writing circuit 4 is connected to the second node N2, a data signal terminal Da and a second enable signal terminal EM2, and configured to transmit a signal of the data signal terminal Da to the second node N2 in response to a signal of the second enable signal terminal EM2. The other electrode of the light-emitting unit OLED may be connected to the second power supply terminal VSS. The first electrode of the light-emitting unit may be the anode of the light-emitting unit.

In this example embodiment, the pixel driving circuit can be applied to a display panel. The display panel can include a picture updating period and a picture holding period in one frame driving period. In the picture updating period, the pixel driving circuits in the display panel can be scanned line by line, and the scanning period of each pixel driving circuit can at least include a reset stage, a data writing stage and a light-emitting stage. In the reset stage, the first node N1 and the first electrode of the light-emitting unit can be reset. In the data writing stage, the data writing circuit is turned on to transmit the signal from the data signal terminal Da to the second node, the compensation circuit is turned on to connect the first node N1 and the third node N3, and the driving circuit 1 is turned on to write the data signal and the threshold voltage of the driving circuit into the first node N1. In the light-emitting stage, the control circuit is turned on to connect the first power supply terminal VDD and the second node N2, and connect the third node N3 and the first electrode of the light-emitting unit. In the picture holding period, the gate driving signal terminal Gate outputs an invalid level, the first enable signal terminal EM1 alternately outputs a valid level and an invalid level, and the second enable signal terminal EM2 alternately outputs a valid level and an invalid level, and the valid level period of the second enable signal terminal EM2 is within the invalid level period of the first enable signal terminal EM1, and the valid level period of the first enable signal terminal EM1 is within the invalid level period of the second enable signal terminal EM2. Meanwhile, the data signal terminal Da outputs a stable voltage, which is different from the voltage of the first power supply terminal VDD. For example, the stable voltage output by the data signal terminal Da may be greater than or less than the voltage of the first power supply terminal VDD. During the picture holding period, the data writing circuit 4 is turned on and off alternately, and the control circuit 3 is turned on and off alternately, and the turn-on period of the data writing circuit 4 is within the turn-off period of the control circuit 3, and the turn-on period of the control circuit 3 is within the turn-off period of the data writing circuit 4. On the one hand, the data signal terminal Da can alternately write a stable voltage to the second node N2, and the bias voltage of the driving circuit at the first node N1 and the second node N2 changes all the time, thereby reducing the drift of the characteristic curve due to the long-term unchanged bias voltage of the driving circuit 1. On the other hand, when the data writing circuit 4 is turned on, the control circuit 3 is turned off, then the stable voltage on the data signal terminal Da will not affect the normal light emission of the pixel driving circuit.

It should be noted that in this example embodiment, the valid level refers to the logic level that controls the target circuit to be turned on, and the invalid level refers to the logic level that controls the target circuit to be turned off. For example, when the target circuit is a P-type transistor, the valid level is a low level and the invalid level is a high level.

When the target circuit is an N-type transistor, the valid level is a high level and the invalid level is a low level.

It should be understood that in other example embodiments, the data signal terminal Da may also output an unstable voltage during the picture holding period. As long as the data writing circuit 4 inputs a voltage signal different from the voltage of the first power supply terminal to the second node N2 during the picture holding period, the drift problem of the characteristic curve can be improved. In other example embodiments, after each pixel driving circuit completes its own scanning, the first enable signal terminal EM1 and the second enable signal terminal EM2 can also alternately output the valid level and the invalid level after any time period. That is, the first enable signal terminal EM1 and the second enable signal terminal EM2 can also alternately output the valid level and the invalid level during the above picture updating period. Since the data signal terminals of the pixel driving circuits in the same column are connected to the same data line, at this time, the pixel driving circuit can write a voltage signal different from the voltage of the first power supply terminal to the second node N2 by using the data signal corresponding to the un-scanned pixel driving circuit.

In this example embodiment, as shown in FIG. 4, the driving circuit 1 may include a driving transistor T3. The driving transistor T3 has a first electrode connected to the second node N2, a second electrode connected to the third node N3, and a gate connected to the first node N1. The compensation circuit 2 may include a second transistor T2. The second transistor T2 has a first electrode connected to the first node N1, a second electrode connected to the third node N3, and a gate connected to the gate driving signal terminal Gate. The data writing circuit 4 may include a fourth transistor T4. The fourth transistor T4 has a first electrode connected to the data signal terminal Da, a second electrode connected to the second node N2, and a gate connected to the second enable signal terminal EM2. The control circuit 3 may include a fifth transistor T5 and a sixth transistor T6. The fifth transistor has a first electrode connected to the first power supply terminal VDD, a second electrode connected to the second node N2, and a gate connected to the first enable signal terminal EM1. The sixth transistor T6 has a first electrode connected to the third node N3, a second electrode connected to the first electrode of the light-emitting unit, and a gate connected to the first enable signal terminal EM1.

In this example embodiment, the driving transistor T3 may be a P-type transistor. For example, the driving transistor T3 may be a P-type low-temperature polysilicon transistor. The second transistor T2, the fourth transistor T4, the fifth transistor T5 and the sixth transistor T6 may also be P-type transistors.

In this example embodiment, the level logic of the second enable signal terminal EM2 and the first enable signal terminal EM1 can be opposite, which may realize that when the fourth transistor T4 is turned on, the fifth transistor T5 and the sixth transistor T6 are turned off. It should be understood that, in other example embodiments, the timing on the second enable signal terminal EM2 and the first enable signal terminal EM1 may have other corresponding relationships, as long as the valid level period of the second enable signal terminal EM2 is within the invalid level period of the first enable signal terminal EM1.

Figures 5, 6:
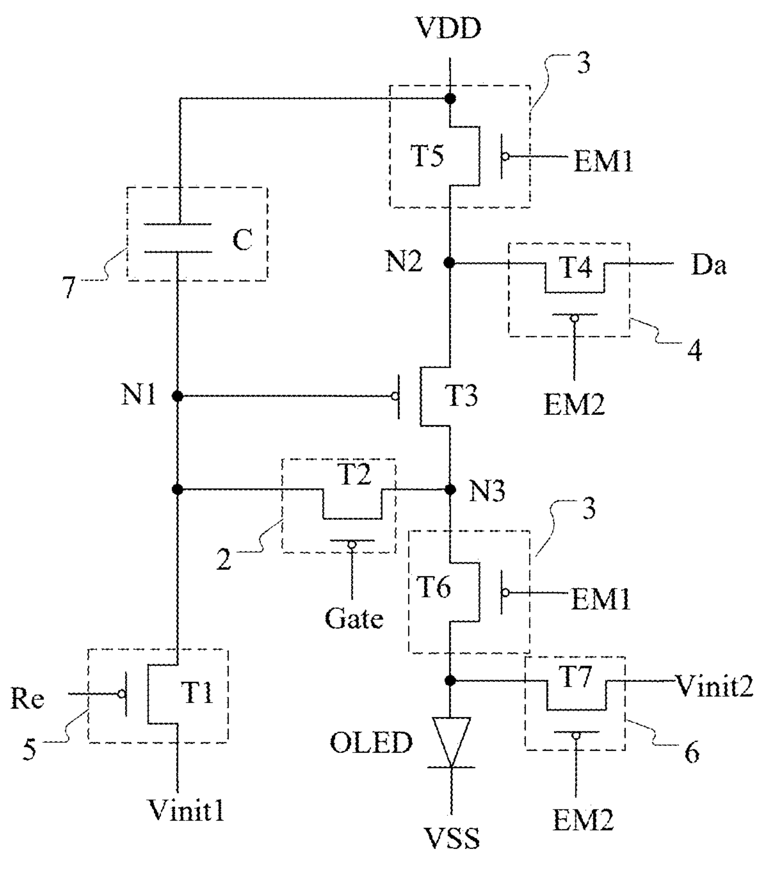
FIG. 5 is a structural schematic diagram of the pixel driving circuit of another example embodiment of the present disclosure.
FIG. 6 is a timing chart of each node in the pixel driving circuit shown in FIG. 5.

In this example embodiment, as shown in FIG. 5, it is a structural schematic diagram of the pixel driving circuit of another example embodiment of the present disclosure. The pixel driving circuit shown in FIG. 5 includes not only the structure of the pixel driving circuit shown in FIG. 4, but also includes: a first reset circuit 5, a second reset circuit 6 and a storage circuit 7. The first reset circuit 5 is connected to the first node N1, a first initial signal terminal Vinit1 and a reset signal terminal Re, and configured to transmit a signal of the first initial signal terminal Vinit to the first node N1 in response to a signal of the reset signal terminal Re. The second reset circuit 6 is connected to the first electrode of the light-emitting unit, a second initial signal terminal Vinit2 and the second enable signal terminal EM2, and configured to transmit a signal of the second initial signal terminal Vinit2 to the first electrode of the light-emitting unit in response to the signal of the second enable signal terminal EM2. The storage circuit 7 is connected between the first node N1 and the first power supply terminal VDD. The first initial signal terminal Vinit1 and the second initial signal terminal Vinit2 can output stable voltages, and the voltage of the second initial signal terminal Vinit2 can be equal to or close to the voltage of the second power supply terminal VSS.

In this example embodiment, the control terminal of the second reset circuit 6 is connected to the second enable signal terminal EM2. Since the second enable signal terminal EM2 alternately outputs high and low levels during the picture holding period, which may make the light-emitting unit OLED to be turned on and off more times in the same time interval. In the case of low gray scale and low frequency display, resetting of the anode is likely to cause the display panel to flicker, so this setting can effectively improve the flicker problem of the panel by increasing the number of times of the anode resetting. It should be understood that, in other example embodiments, the control terminal of the second reset circuit 6 can also be connected to other signal terminals. For example, the control terminal of the second reset circuit 6 can also be connected to the reset signal terminal Re, and the second reset circuit 6 can transmit the signal of the second initial signal terminal Vinit2 to the first electrode of the light-emitting unit in response to the signal of the reset signal terminal Re. Furthermore, in other example embodiments, the second initial signal terminal Vinit2 may be shared with the first initial signal terminal Vinit1.

In this example embodiment, as shown in FIG. 5, the first reset circuit 5 may include a first transistor T1. The first transistor T1 has a first electrode connected to a first initial signal terminal Vinit1, a second electrode connected to the first node N1, and a gate connected to a reset signal terminal Re. The second reset circuit may include a seventh transistor T7. The seventh transistor T7 has a first electrode connected to a second initial signal terminal Vinit2, a second electrode connected to the first electrode of the light-emitting unit, and a gate connected to the second enable signal terminal EM2. The storage circuit 7 may include a capacitor C. The capacitor C is connected between the first node N1 and the first power supply terminal VDD. The first transistor T1 and the seventh transistor T7 may be P-type transistors, such as P-type low-temperature polysilicon transistors.

As shown in FIG. 6, it is the timing diagram of each node in the pixel driving circuit shown in FIG. 5. Gate is the timing of the gate driving signal terminal, EM1 is the timing of the first enable signal terminal, EM2 is the timing of the second enable signal terminal, Re is the timing of the reset signal terminal, and Da is the timing of the data signal terminal. The pixel driving circuit can be applied to a display panel. The display panel can include a picture updating period T1 and a picture holding period T2 in one frame driving period. In the picture updating period T1, the pixel driving circuits in the the display panel can be scanned line by line, and the scanning period of each pixel driving circuit can include: a first sub-stage t1, a second sub-stage T2, a third sub-stage t3 and a fourth sub-stage t4. In the first sub-stage t1, the reset signal terminal Re and the second enable signal terminal EM2 output a valid level (low level), the gate driving signal terminal Gate and the first enable signal terminal EM1 output an invalid level (high level), the first transistor T1 and the seventh transistor T7 are turned on, the first initial signal terminal Vinit1 writes an initial signal to the first node, and the second initial signal terminal Vinit2 writes an initial signal to the first electrode of the light-emitting unit. In the second sub-stage, the gate driving signal terminal Gate and the second enable signal terminal EM2 output a valid level signal, the reset signal terminal Re and the first enable signal terminal EM1 output an invalid level signal, the second transistor T2 and the fourth transistor T4 are turned on, and the data signal terminal Da outputs a data signal to write the voltage Vdata+Vth to the first node N1, where Vdata is the voltage of the data signal and Vth is the threshold voltage of the driving transistor T3. In the third sub-stage, the second enable signal terminal EM2 outputs a valid level, the first enable signal terminal EM1, the gate driving signal terminal Gate and the reset signal terminal output an invalid level, and the voltage of the first node N1 remains unchanged. In the fourth sub-stage, the first enable signal terminal EM1 outputs a valid level, the second enable signal terminal EM2, the gate driving signal terminal Gate and the reset signal terminal output an invalid level, the fifth transistor T5 and the sixth transistor T6 are turned on, and the driving transistor T3 outputs a driving current to the light-emitting unit OLED under the action of the voltage Vdata+Vth stored in the capacitor C. According to the output current formula of the driving transistor $I=(\mu WCox/2L)(Vgs-Vth)^2$, where μ is the carrier mobility; Cox is the gate capacitance per unit area, W is the width of the driving transistor channel, L is the length of the driving transistor channel, Vgs is the gate-source voltage difference of the driving transistor, and Vth is the threshold voltage of the driving transistor, in this example embodiment, the output current of the driving transistor in the pixel driving circuit is $I=(\mu WCox/2L)(Vdata+Vth-Vdd-Vth)^2$. In the picture holding period T2, the data signal terminal Da outputs a stable voltage, which is different from the voltage of the first power supply terminal VDD. For example, the data signal terminal Da may output a stable voltage which is greater than or less than the voltage of the first power supply terminal VDD. In the picture holding period T2, the gate driving signal terminal Gate outputs an invalid level, the first enable signal terminal EM1 alternately outputs a valid level and an invalid level, and the second enable signal terminal EM2 alternately outputs a valid level and an invalid level, and the valid level period of the second enable signal terminal is within the invalid level period of the first enable signal terminal. On the one hand, the data signal terminal Da can intermittently write a stable voltage to the second node N2, and the bias voltage of the driving transistor T3 at the first node N1 and the second node N2 is always changing, so that this setting can reduce the drift of the characteristic curve due to the long-term unchanged bias voltage of the driving circuit T3. On the other hand, when the data writing circuit 4 is turned on, the control circuit 3 is turned off, so that the stable voltage on the data signal terminal Da will not affect the normal light emission of the pixel driving circuit.

In this example embodiment, the first sub-stage of the pixel driving circuit of the current row may be located in the same time period as the second sub-stage of the pixel driving circuit of the adjacent previous row.

It should be understood that, in other example embodiments, the driving method of the pixel driving circuit may not include the third sub-stage t3. In addition, in this example embodiment, the display panel enters the picture holding period T2 after all pixel driving circuits in the display panel complete the scanning. In other example embodiments, after each pixel driving circuit completes its own scanning, the first enable signal terminal EM1 and the second enable signal terminal EM2 can alternately output the valid level and the invalid level after any period. That is, the first enable signal terminal EM1 and the second enable signal terminal EM2 can also alternately output the valid level and the invalid level during the above picture updating period. Since the data signal terminals of the pixel driving circuits in the same column are connected to the same data line, at this time, the pixel driving circuit can write a voltage signal different from the voltage of the first power supply terminal to the second node N2 by using the data signal corresponding to the un-scanned pixel driving circuit.

In this example embodiment, the first transistor T1 and the second transistor T2 are P-type low-temperature polysilicon transistors. It should be understood that in other example embodiments, the first transistor T1 and the second transistor T2 can also be N-type transistors. For example, the first transistor T1 and the second transistor T2 can be metal oxide transistors with a small leakage current.

Figure 7:
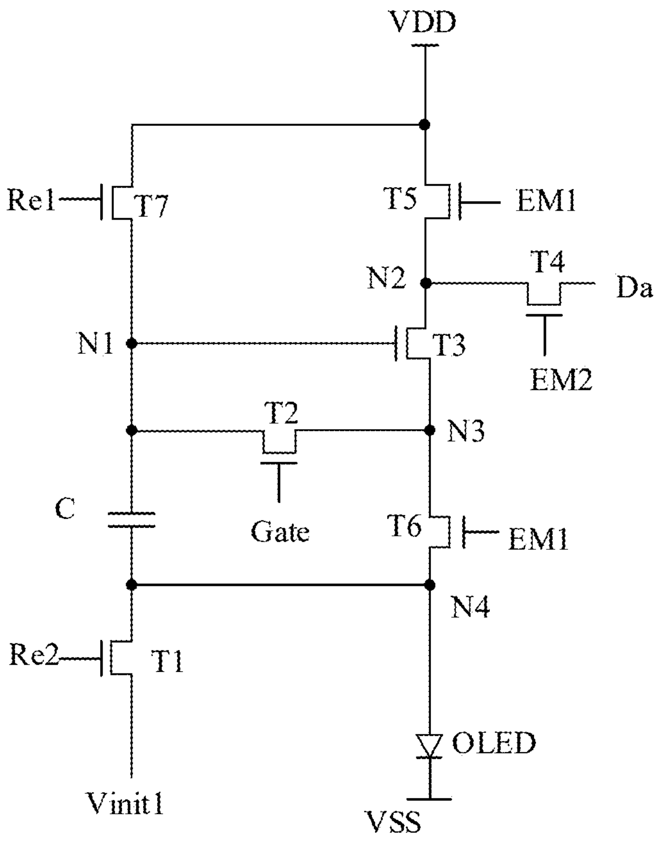
FIG. 7 is a structural schematic diagram of the pixel driving circuit of another example embodiment of the present disclosure.
Figure 8:
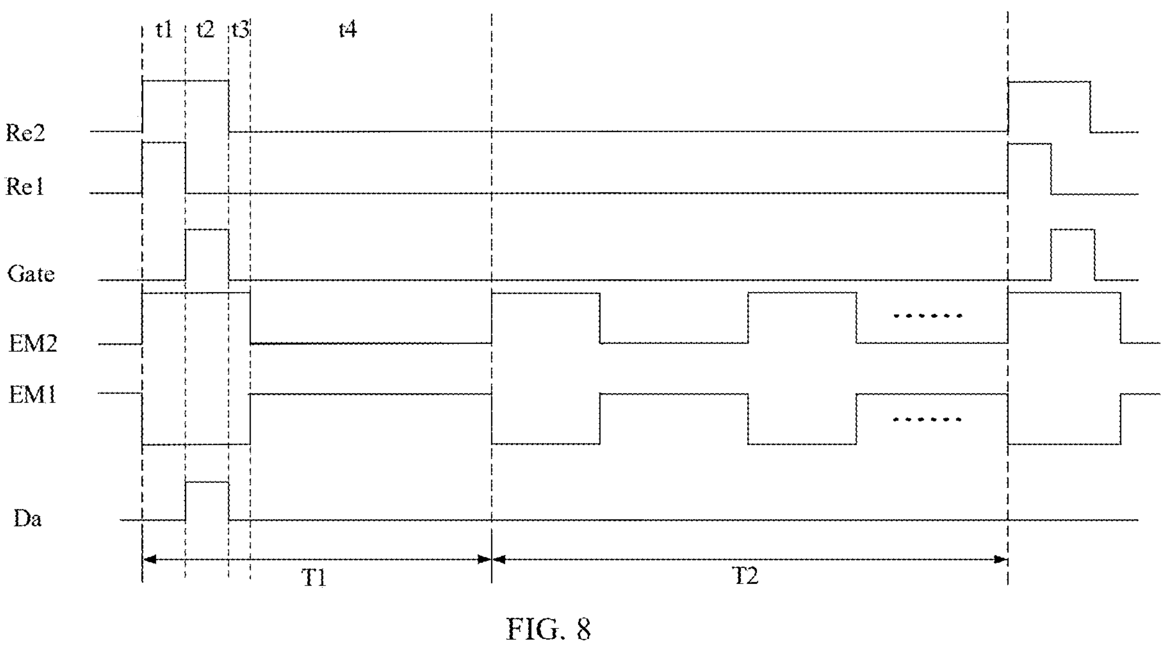
FIG. 8 is a timing chart of each node in the pixel driving circuit shown in FIG. 7.

In this example embodiment, the driving transistor T3 is a P-type transistor. It should be understood that, in other example embodiments, the driving transistor T3 may also be an N-type transistor. For example, as shown in FIGS. 7 and 8, FIG. 7 is a structural schematic diagram of the pixel driving circuit of another example embodiment of the present disclosure, FIG. 8 is a timing chart of each node in the pixel driving circuit shown in FIG. 7. All the transistors in FIG. 7 may be N-type transistors. In FIG. 8, Gate is the timing of the gate driving signal terminal, EM1 is the timing of the first enable signal terminal, EM2 is the timing of the second enable signal terminal, Re1 is the timing of the first reset signal terminal, Re2 is the timing of the second reset signal terminal, and Da is the timing of the data signal terminal.

The pixel driving circuit can be applied to a display panel, and the display panel can include a picture updating period T1 and a picture holding period T2 in one frame driving period. In the picture updating period T1, the pixel driving circuits in the display panel can be scanned line by line, and the scanning period of each pixel driving circuit can include a data first sub-stage t1, a second sub-stage T2, a third sub-stage t3 and a fourth sub-stage t4. In the first sub-phase t1, the first enable signal terminal EM1 and the gate driving signal terminal Gate output an invalid level signal (low-level signal), the first reset signal terminal Re1, the second reset signal terminal Re2 and the second enable signal terminal EM2 output a valid level signal (high-level signal), the first transistor T1 and the seventh transistor T7 are turned on, the high-level signal of the first power supply terminal VDD is transmitted to the first node N1, and the signal of the initial signal terminal Vinit is transmitted to the fourth node N4. In the second sub-phase t2, the first enable signal terminal EM1 and the first reset signal terminal Re1 output a low-level signal, the gate driving signal terminal Gate, the second enable signal terminal EM2 and the second reset signal terminal Re2 output a high-level signal, the fourth transistor T4 and the second transistor T2 are turned on, and the data signal terminal Da writes the compensation voltage Vdata+

Vth to the first node N1. In the third sub-stage t3, the gate driving signal terminal Gate, the first enable signal terminal EM1, the first reset signal terminal Re1 and the second reset signal terminal Re2 output a low-level signal, and the second enable signal terminal EM2 outputs a high-level signal, and the voltage of the first node N1 remains unchanged. In the fourth sub-stage t4, the first reset signal terminal Re1, the second reset signal terminal Re2, the gate driving signal terminal Gate and the second enable signal terminal EM2 output a low-level signal, the first enable signal terminal EM1 outputs a high-level signal, the fifth transistor T5 and the sixth transistor T6 are turned on, and the voltage of the fourth node N4 changes from Vinit to Voled, where Vinit is the voltage of the initial signal terminal. Under the coupling effect of the capacitor C, the voltage of the first node N1 changes to Vdata+Vth+Voled−Vinit, so that the output current of the driving transistor T3 in this embodiment is $I=(\mu WCox/2L)(Vdata+Vth+Voled-Vinit-Voled-Vth)^2-(\mu WCox/2L)(Vdata-Vinit)^2$. In the picture holding period T2, the data signal terminal Da outputs a stable voltage, which is different from the voltage of the first power supply terminal VDD. For example, the data signal terminal Da may output a stable voltage which is greater than or less than the voltage of the first power supply terminal VDD. At the same time, in the picture holding period T2, the gate driving signal terminal Gate inputs an invalid level, the first enable signal terminal EM1 alternately inputs a valid level and an invalid level, and the second enable signal terminal EM2 alternately inputs a valid level and an invalid level, the valid level period of the second enable signal terminal is within the invalid level period of the first enable signal terminal, and the valid level period of the first enable signal terminal is within the invalid level period of the second enable signal terminal. On the one hand, in this example embodiment, the data signal terminal Da can intermittently write a stable voltage to the second node N2, and the bias voltage of the driving transistor T3 at the first node N1 and the second node N2 is always changing, so that this setting can reduce the drift of the characteristic curve due to the long-term unchanged bias voltage of the driving circuit T3. On the other hand, when the data writing circuit 4 is turned on, the control circuit 3 is turned off, so that the stable voltage on the data signal terminal Da will not affect the normal light emission of the pixel driving circuit.

This example embodiment further provides a driving method of a pixel driving circuit, for driving the pixel driving circuit described above, wherein the driving method includes:

in a first sub-stage of a first stage, the gate driving signal terminal and the second enable signal terminal outputting a valid level, and the first enable signal terminal outputting an invalid level;

in a second sub-stage of the first stage, the first enable signal terminal outputting a valid level, and the second enable signal terminal and the gate driving signal terminal outputting an invalid level;

in a second stage, the gate driving signal terminal outputting an invalid level, the first enable signal terminal alternately outputting a valid level and an invalid level, and the second enable signal terminal alternately outputting a valid level and an invalid level, wherein, a valid level period of the second enable signal terminal is within an invalid level period of the first enable signal terminal, and in the second stage, a level written to the second node by the data signal terminal is at least partially different from a voltage of the first power supply terminal.

In this example embodiment, the pixel driving circuit is applied to a display panel, and one frame period of the display panel includes a picture updating period and a picture holding period. In one frame period, the first stages of all pixel driving circuits in the display panel are located in the picture updating period, and the second stages of all pixel driving circuits in the display panel are located in the picture holding period.

The driving method of the pixel driving circuit has been described in detail in the above contents, which will not be repeated herein.

Figure 9:
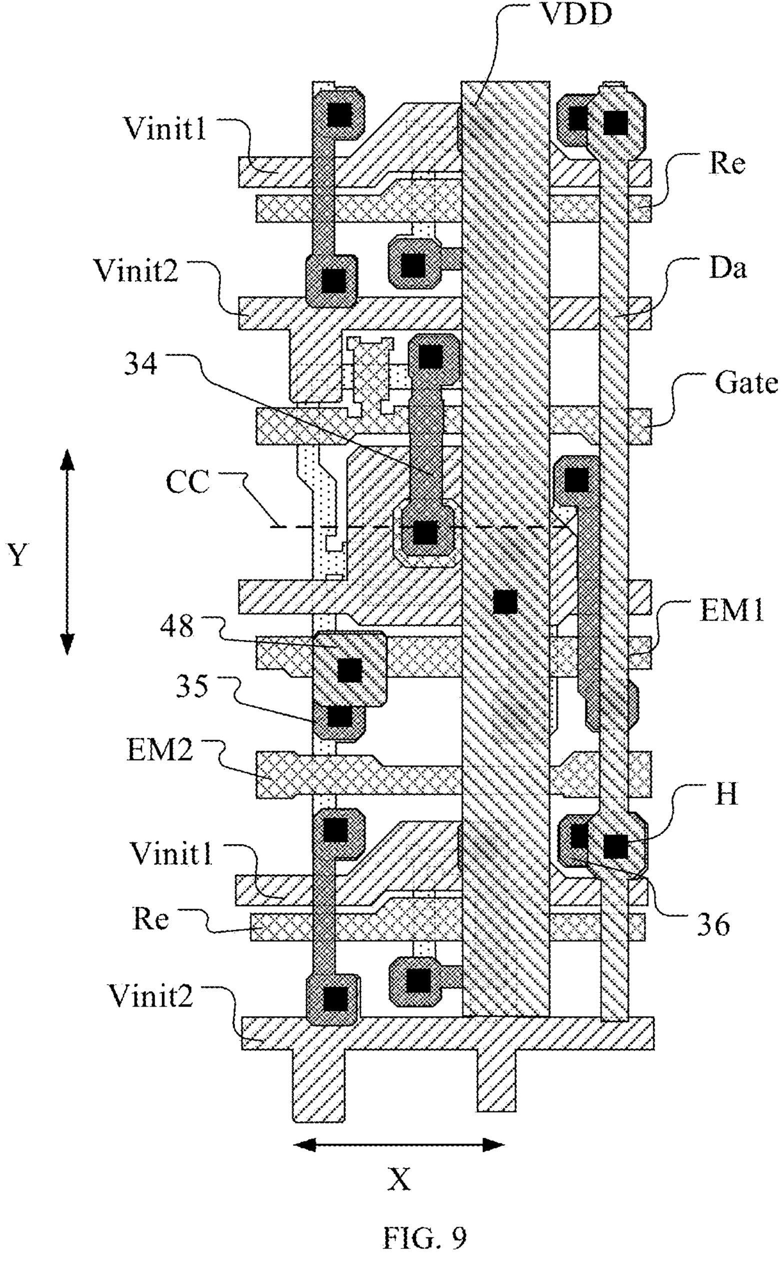
FIG. 9 is a structural layout of the display panel of an example embodiment of the present disclosure.
Figure 10:
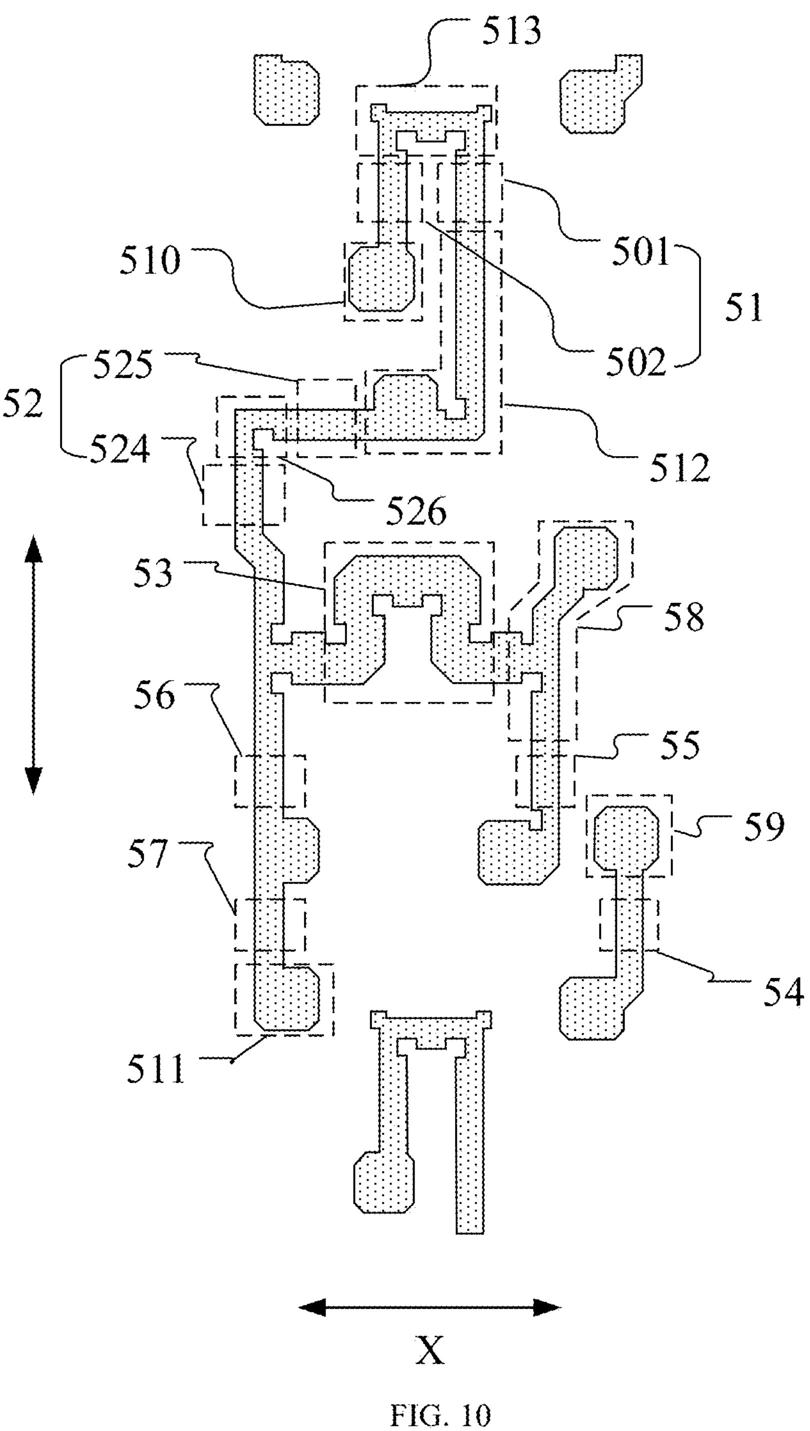
FIG. 10 is a structural layout of the active layer in FIG. 9.
Figure 11:
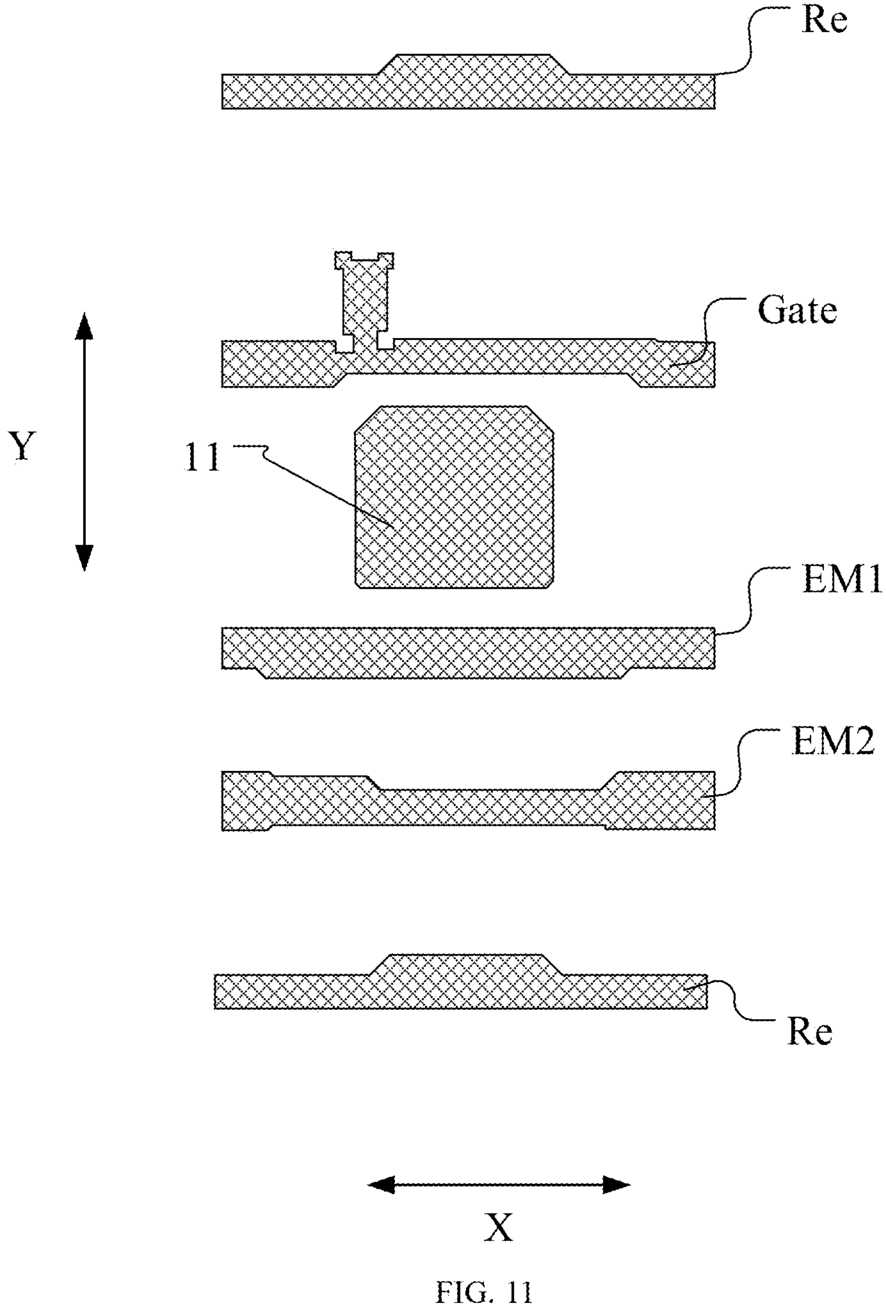
FIG. 11 is a structural layout of the first conductive layer in FIG. 9.
Figure 12:
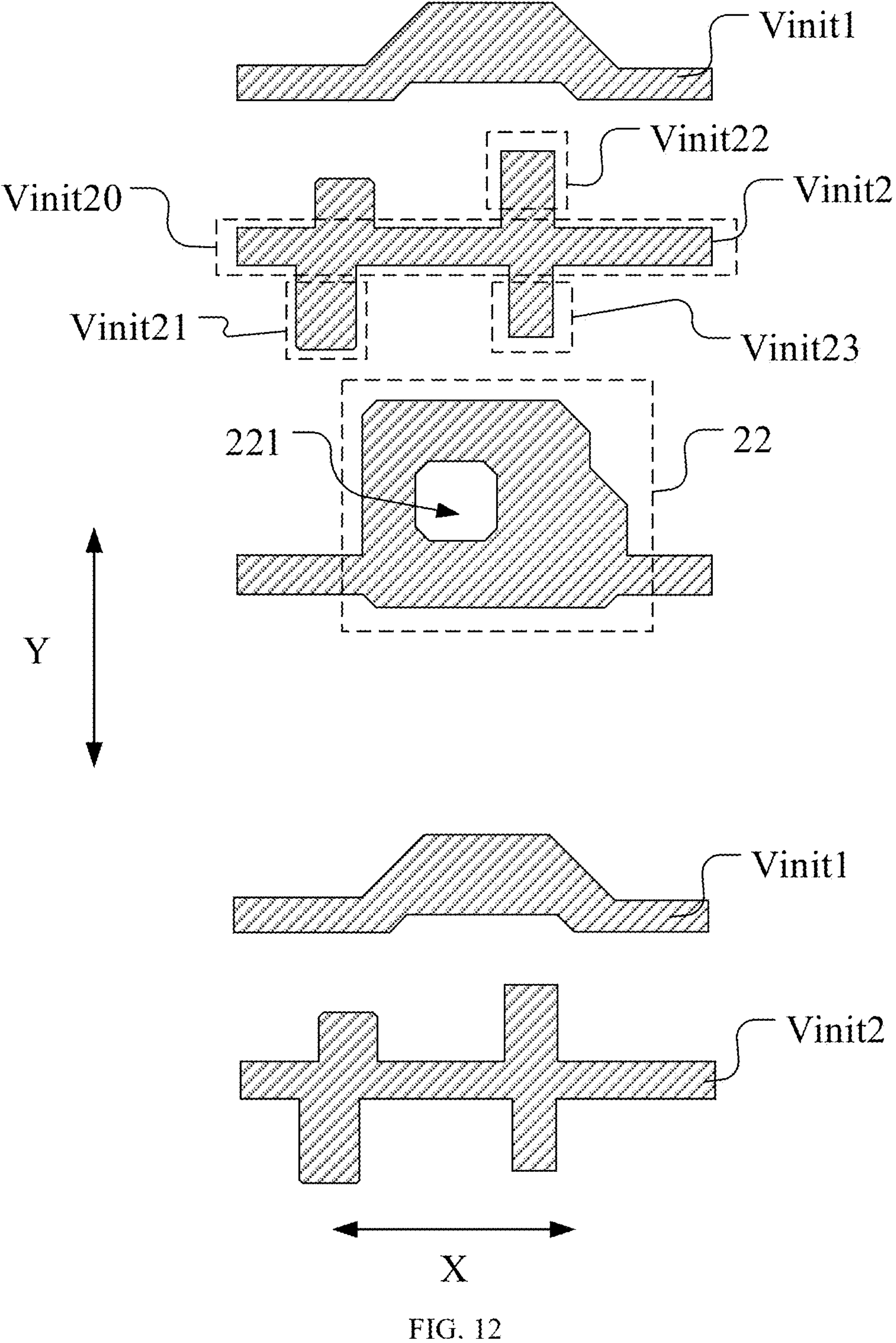
FIG. 12 is a structural layout of the second conductive layer in FIG. 9.
Figure 13:
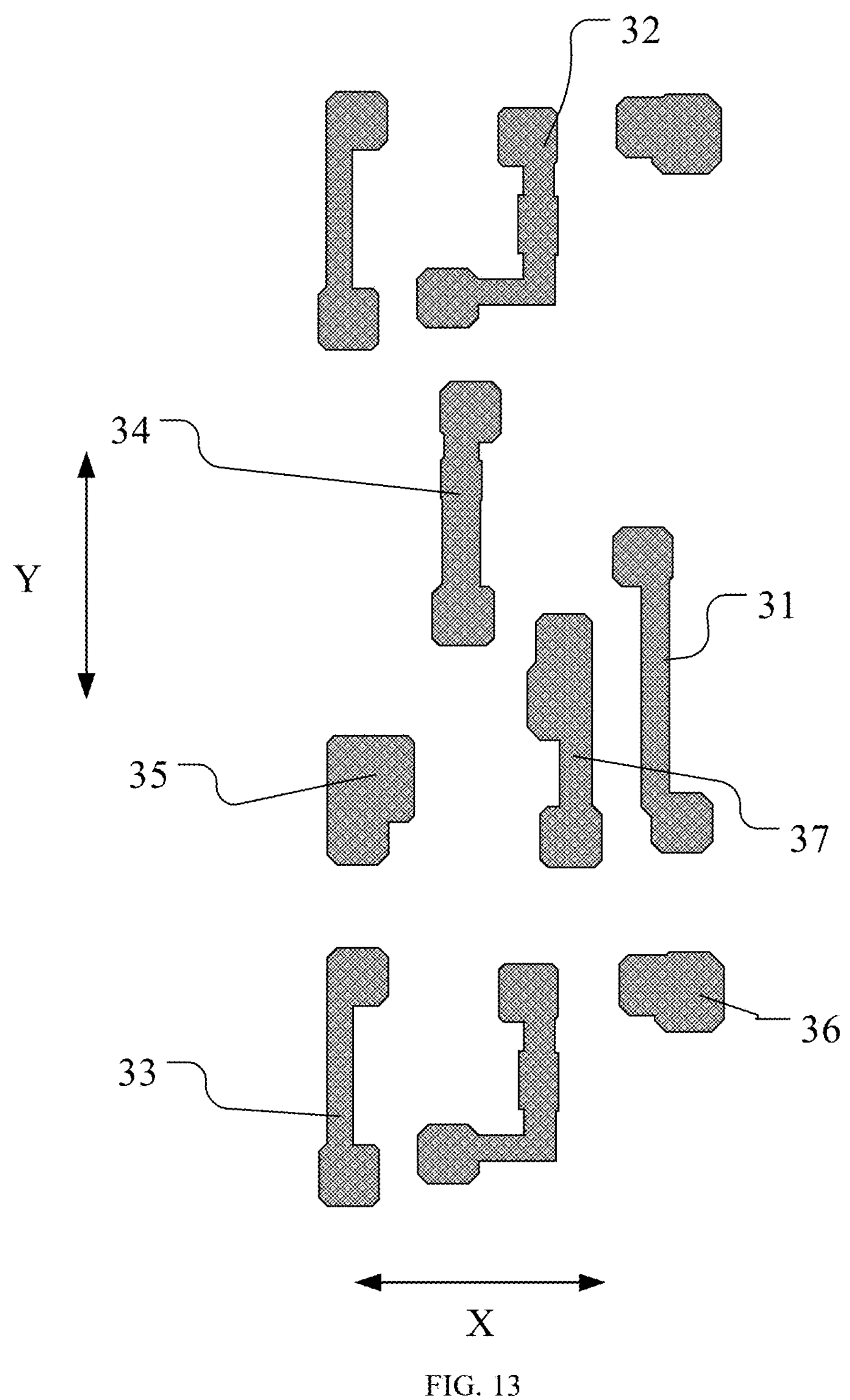
FIG. 13 is a structural layout of the third conductive layer in FIG. 9.
Figure 14:
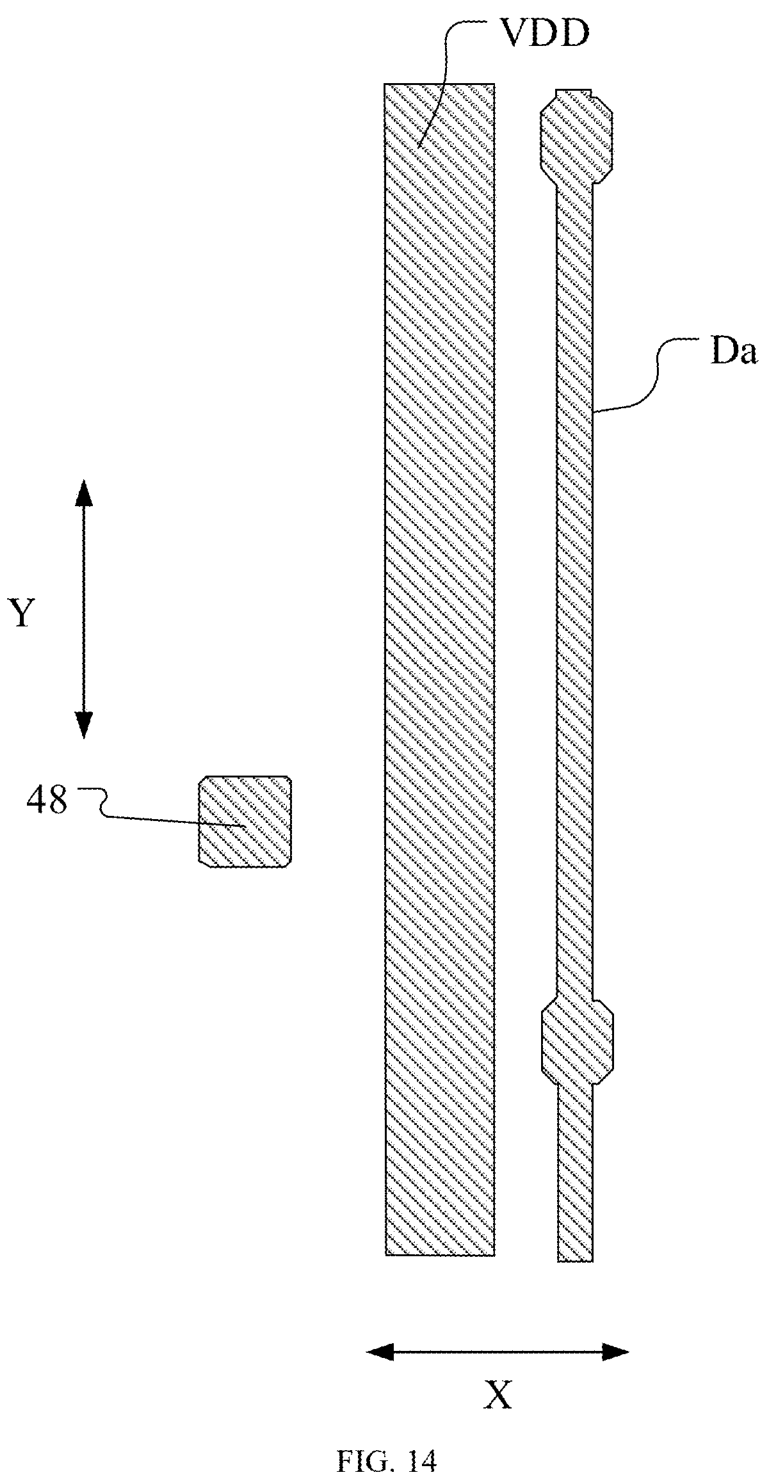
FIG. 14 is a structural layout of the fourth conductive layer in FIG. 9.
Figure 15:
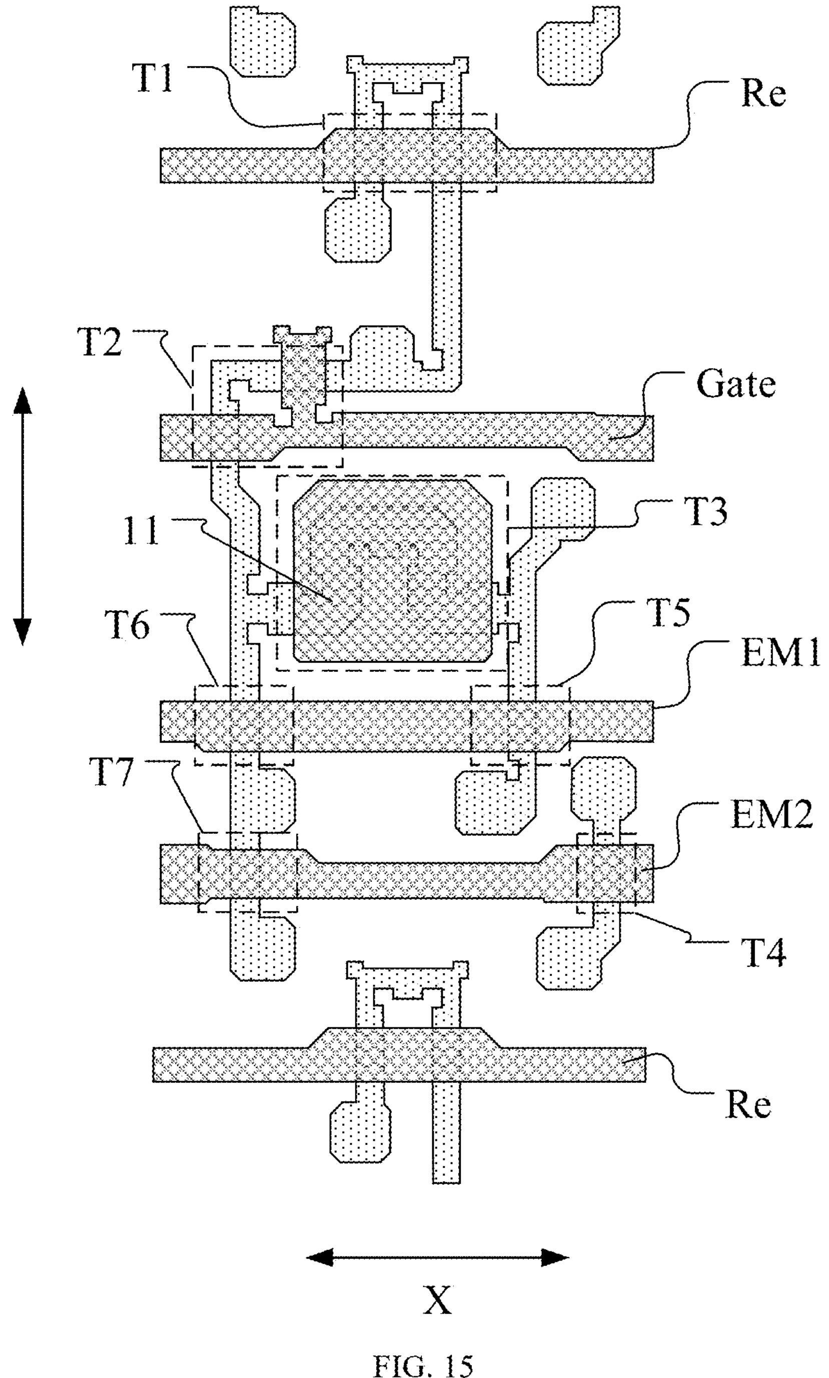
FIG. 15 is a structural layout of the active layer and the first conductive layer in FIG. 9.
Figure 16:
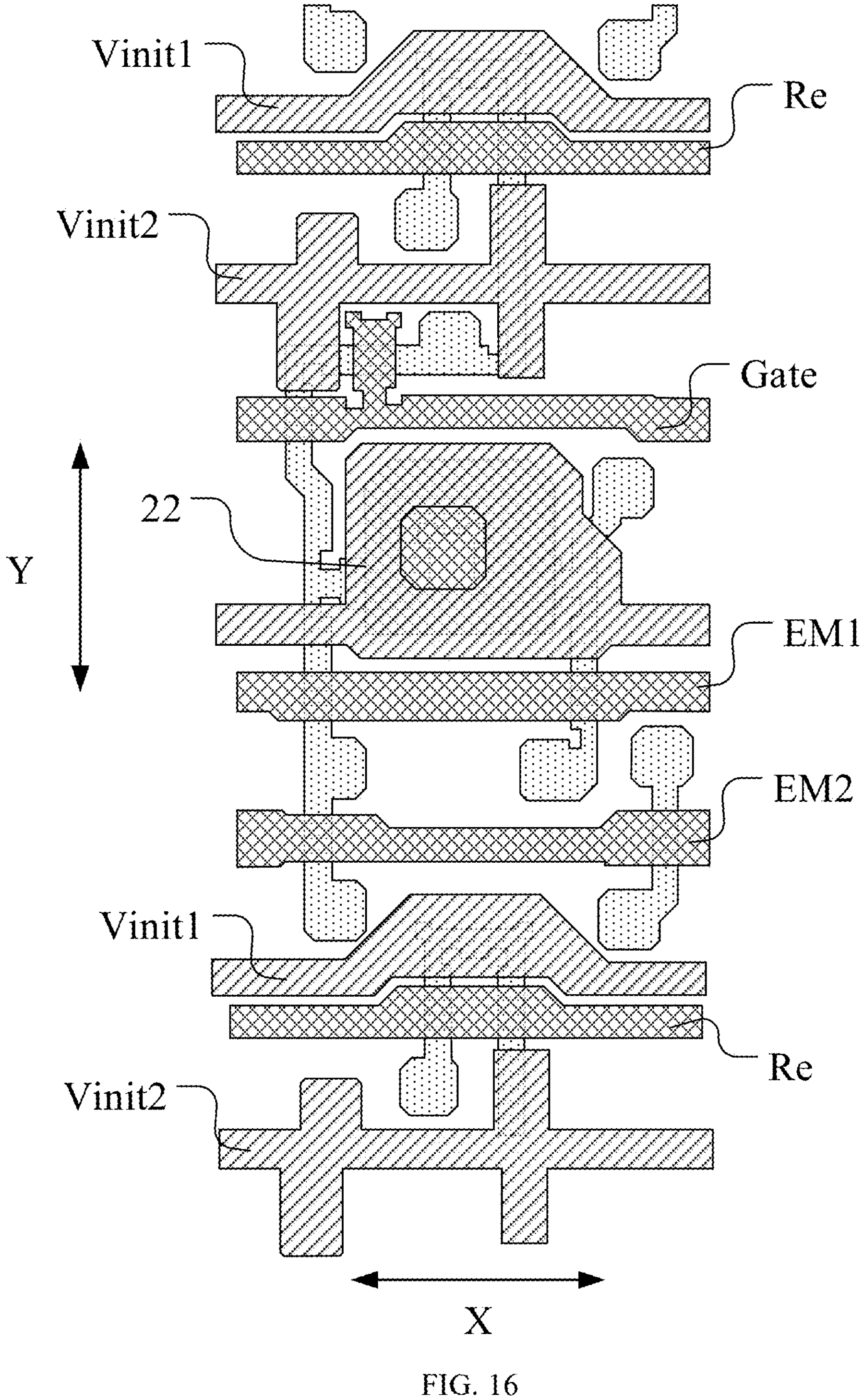
FIG. 16 is a structural layout of the active layer, the first conductive layer and the second conductive layer in FIG. 9.
Figure 17:
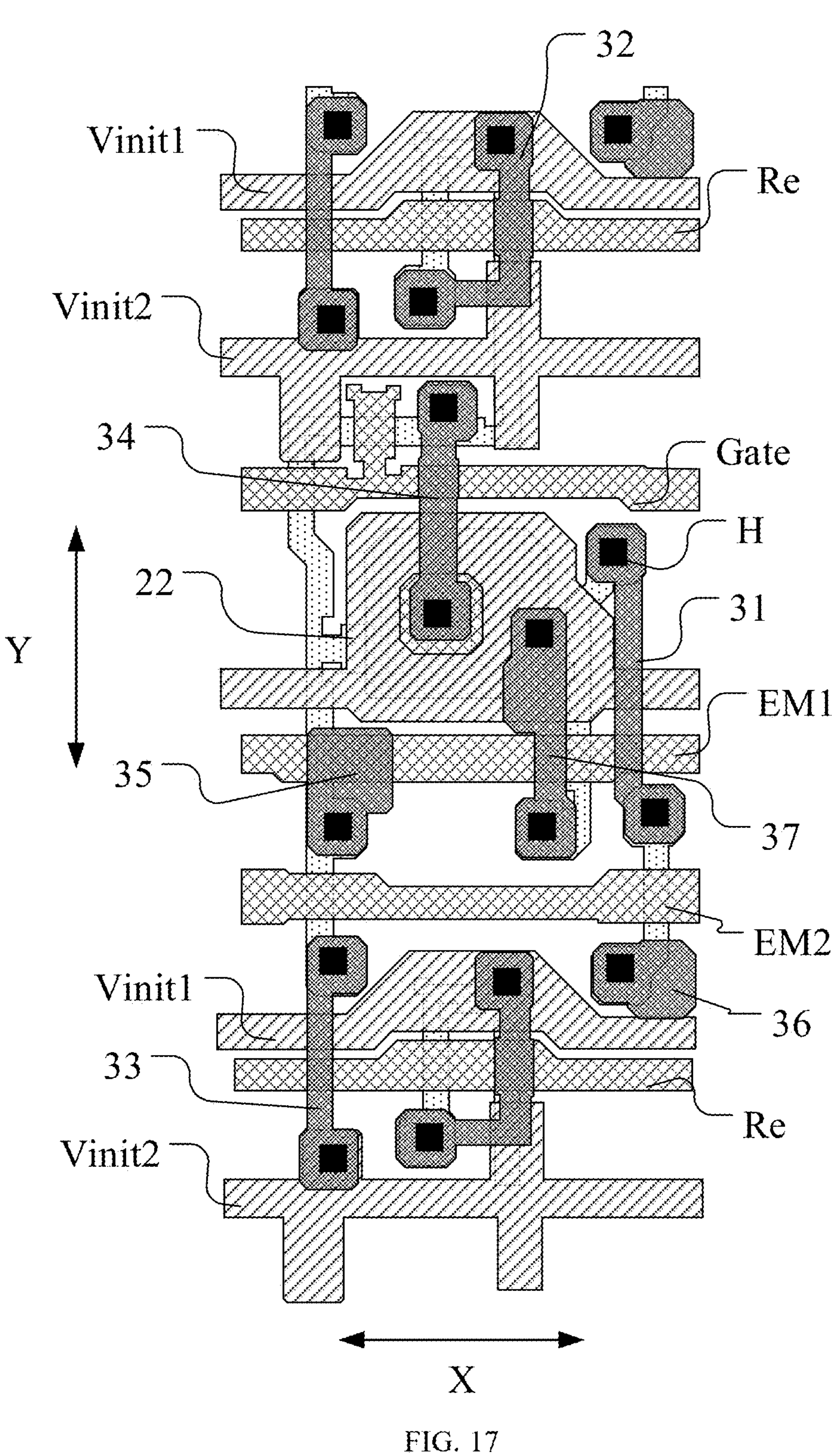
FIG. 17 is a structural layout of the active layer, the first conductive layer, the second conductive layer and the third conductive layer in FIG. 9.

This example embodiment further provides a display panel, which may include the pixel driving circuit described above. The pixel driving circuit in the display panel can be as shown in FIG. 5. The display panel may further include a base substrate, an active layer, a first conductive layer, a second conductive layer, a third conductive layer and a fourth conductive layer which are sequentially stacked, wherein an insulating layer is arranged between the layers. As shown in FIGS. 9-17, FIG. 9 is a structural layout of the display panel of an example embodiment of the present disclosure, FIG. 10 is a structural layout of the active layer in FIG. 9, FIG. 11 is a structural layout of the first conductive layer in FIG. 9, FIG. 12 is a structural layout of the second conductive layer in FIG. 9, FIG. 13 is a structural layout of the third conductive layer in FIG. 9, FIG. 14 is a structural layout of the fourth conductive layer in FIG. 9, FIG. 15 is a structural layout of the active layer and the first conductive layer in FIG. 9, FIG. 16 is a structural layout of the active layer, the first conductive layer and the second conductive layer in FIG. 9, and FIG. 17 is a structural layout of the active layer, the first conductive layer, the second conductive layer and the third conductive layer in FIG. 9.

As shown in FIGS. 9, 10 and 15, the active layer may include a first active part 51, a second active part 52, a third active part 53, a fourth active part 54, a fifth active part 55, a sixth active part 56, a seventh active part 57, an eighth active part 58, a ninth active part 59, a tenth active part 510, an eleventh active part 511, a twelfth active part 512, a third active sub-part 513, and a sixth active sub-part 526. The first active part 51 is used to form the channel region of the first transistor T1. The second active part 52 is used to form the channel region of the second transistor T2. The third active part 53 is used to form the channel region of the driving transistor T3. The fourth active part 54 is used to form the channel region of the fourth transistor T4. The fifth active part 55 is used to form the channel region of the fifth transistor T5. The sixth active part 56 is used to form the channel region of the sixth transistor T6. The seventh active part 57 is used to form the channel region of the seventh transistor T7. The first transistor T1 and the second transistor T2 have a double-gate structure. Correspondingly, the first active part 51 may include a first active sub-part 501 and a second active sub-part 502, and a third active sub-part 513 is connected between the first active sub-part 501 and the second active sub-part 502. The second active part 52 may include a fourth active sub-part 524 and a fifth active sub-part 525, and a sixth active sub-part 526 is connected between the fourth active sub-part 524 and the fifth active sub-part 525. The eighth active part 58 is connected between the fifth active part 55 and the third active part 53. The ninth active part 59 is connected to a side of the fourth active part 54. The tenth active part 510 is connected to an end of the first active part 51 away from the second active part 52. The eleventh active part 511 is connected to an end of the seventh active part 57 away from the sixth active part 56. The twelfth active part 512 is connected between the second active part 52 and the first active part 51. The active layer may be formed of polysilicon.

As shown in FIGS. 9, 11, and 15, the first conductive layer may include a reset signal line Re, a gate line Gate, a first enable signal line EM1, a second enable signal line EM2, and a first conductive part 11. The reset signal line Re can be used to provide the reset signal terminal in FIG. 5, the gate line Gate can be used to provide the gate driving signal terminal in FIG. 5, the first enable signal line EM1 can be used to provide the first enable signal terminal in FIG. 5, and the second enable signal line EM2 can be used to provide the second enable signal terminal in FIG. 5. The orthographic projection of the reset signal line Re on the base substrate, the orthographic projection of the gate line Gate on the base substrate, the orthographic projection of the first enable signal line EM1 on the base substrate, and the orthographic projection of the second enable signal line EM2 on the base substrate can all extend along the first direction X. The first direction X may be the row direction of the display panel, and the pixel driving circuits in the display panel may be driven line by line. In this example embodiment, the orthographic projection of a structure on the base substrate extending in a certain direction can be understood as the orthographic projection of the structure on the base substrate extending in the direction in a straight line or in a bending line. The orthographic projection of the reset signal line Re on the base substrate can cover the orthographic projection of the first active part 51 on the base substrate, and part of the structure of the reset signal line Re can be used to form the gate of the first transistor T1. The orthographic projection of the first conductive part 11 on the base substrate covers the third active part 53, and the first conductive part 11 can be used to form the gate of the driving transistor T3 and the first electrode of the capacitor. The orthographic projection of the first enable signal line EM1 on the base substrate covers the orthographic projection of the fifth active part 55 on the base substrate and the orthographic projection of the sixth active part 56 on the base substrate, and part of the structure of the first enable signal line EM1 can be used to form the gate of the fifth transistor T5 and the gate of the sixth transistor T6 respectively. The orthographic projection of the second enable signal line EM2 on the base substrate covers the orthographic projection of the fourth active part 54 on the base substrate and the orthographic projection of the seventh active part 57 on the base substrate, and part of the structure of the second enable signal line EM2 can be used to form the gate of the fourth transistor and the gate of the seventh transistor T7 respectively. The orthographic projection of the gate line Gate on the base substrate covers the orthographic projection of the second active part 52 on the base substrate, and part of the structure of the gate line Gate can be used to form the gate of the second transistor T2. As shown in FIGS. 9, 11 and 15, the orthographic projection of the reset signal line Re on the base substrate, the orthographic projection of the gate line Gate on the base substrate, the orthographic projection of the first conductive part 11 on the base substrate, the orthographic projection of the first enable signal line EM1 on the base substrate, and the orthographic projection of the second enable signal line EM2 on the base substrate can be sequentially distributed along the second direction Y. The second direction Y may intersect with the first direction X. For example, the second direction Y may be the column direction of the display panel. The orthographic projection of the ninth active part 59 on the base substrate may be located between the orthographic projection of the first enable signal line EM1 on the base substrate and the orthographic projection of the second enable signal line EM2 on the base substrate. In this example embodiment, the display panel can use the first conductive layer as a mask to conduct the conductive treatment on the active layer. That is, the area of the active layer that is covered by the first conductive layer forms the channel region of the transistor, and the area of the active layer that is not covered by the first conductive layer forms the conductor structure.

As shown in FIGS. 9, 12 and 16, the second conductive layer may include a first initial signal line Vinit1, a second initial signal line Vinit2 and a second conductive part 22. The first initial signal line Vinit1 can be used to provide the first initial signal terminal in FIG. 5, and the second initial signal line Vinit2 can be used to provide the second initial signal terminal in FIG. 5. The orthographic projection of the first initial signal line Vinit1 on the base substrate and the orthographic projection of the second initial signal line Vinit2 on the base substrate can both extend along the first direction X. The orthographic projection of the first initial signal line Vinit1 on the base substrate may be located on a side of the orthographic projection of the reset signal line Re on the base substrate away from the orthographic projection of the first conductive part 11 on the base substrate. The orthographic projection of the second initial signal line Vinit2 on the base substrate may be located on the side of the orthographic projection of the second enable signal line EM2 on the base substrate away from the orthographic projection of the first conductive part 11 on the base substrate.

As shown in FIGS. 9, 12, and 16, the display panel in this example embodiment may include a plurality of rows of pixel driving circuits. An orthographic projection of the second initial signal line Vinit2 in the pixel driving circuit of a current row on the base substrate may be located between an orthographic projection of the reset signal line Re in the pixel driving circuit of an adjacent next row on the base substrate and an orthographic projection of the gate line Gate on the base substrate. As shown in FIG. 12, the second initial signal line Vinit2 located above is the second initial signal line Vinit2 in the pixel driving circuit of the previous row. As shown in FIG. 11, the reset signal line Re located below is the reset signal line Re in the pixel driving circuit of the next row. This setting can improve the integration of the pixel driving circuit. The orthographic projection of the second conductive part 22 on the base substrate may at least partially overlap with the orthographic projection of the first conductive part 11 on the base substrate, and the second conductive part 22 may be used to form the second electrode of the capacitor C. The second conductive parts 22 located in the pixel driving circuits of the same row may be connected to each other.

As shown in FIGS. 9, 12 and 16, the second initial signal line Vinit2 may include a main body line Vinit20, a first protrusion part Vinit21, a second protrusion part Vinit22 and a third protrusion part Vinit23. The orthographic projection of the main body line Vinit20 on the base substrate extends along the first direction X. The first protrusion part Vinit21 is connected to the main body line Vinit20, and the orthographic projection of the first protrusion part Vinit20 on the base substrate extends along the second direction Y. The second protrusion part Vinit22 is connected to the main body line Vinit20, and the orthogonal projection of the second protrusion part Vinit22 on the base substrate extends along the second direction Y. The third protrusion part Vinit23 is connected to the main body line Vinit20, and the orthographic projection of the third protrusion part Vinit23 on the base substrate extends along the second direction Y, and the orthographic projection of the third protrusion part Vinit23 on the base substrate is located on the side of the orthographic projection of the main body line Vinit20 on the base substrate away from the orthographic projection of the second protrusion part Vinit22 on the base substrate. The orthographic projection of the first protrusion Vinit21 of the second initial signal line Vinit2 in the pixel driving circuit of the previous row on the base substrate at least partially overlaps with the orthographic projection of the sixth active sub-part 526 in the pixel driving circuit of the current row on the base substrate, and the second initial signal line Vinit2 can stabilize the voltage of the sixth active sub-part 56, thereby reducing the leakage current of the sixth active sub-part 526 to the source and drain of the second transistor T2. The orthographic projection of the second protrusion part Vinit22 and the third protrusion part Vinit23 of the second initial signal line Vinit2 in the pixel driving circuit of the previous row on the base substrate at least partially overlaps with the orthographic projection of the twelfth active part 512 in the pixel driving circuit of the current row on the base substrate, and the second initial signal line Vinit2 can stabilize the voltage of the twelfth active part 512, thus reducing the fluctuation of the gate voltage of the driving transistor of the pixel driving circuit in the light-emitting stage. The orthographic projection of the first initial signal line ViniT1 on the base substrate may at least partially overlap with the orthographic projection of the third active sub-part 513 on the base substrate, and the first initial signal line Vinit1 may stabilize the voltage of the third active sub-part 513, thereby reducing the leakage current of the third active sub-part 513 to the source and drain of the first transistor t1.

As shown in FIGS. 9, 13 and 17, the third conductive layer may include a first connection part 31, a second connection part 32, a third connection part 33, a fourth connection part 34, a fifth connection part 35, a sixth connection part 36 and a seventh connection part 37. The first connection part 31 may connect the eighth active part 58 and the ninth active part 59 through the via hole H respectively, thereby connecting the second electrode of the fourth transistor T4 and the first electrode of the driving transistor T3. It should be noted that in this example embodiment, the via hole H is represented by a black square, and only some via holes are marked in this example embodiment. The second connection part 32 may connect the first initial signal line ViniT1 and the tenth active part 510 through the via hole respectively, to connect the first electrode of the first transistor T1 and the first initial signal terminal. The third connection part 33 may connect the eleventh active part 511 and the second initial signal line Vinit2 through the via hole respectively, to connect the first electrode of the seventh transistor and the second initial signal terminal. The fourth connection part 34 can connect that first conductive part 11 and the twelfth active part 512 through the via hole respectively, to connect the gate of the driving transistor T3, the first electrode of the second transistor T2 and the second electrode of the first transistor T1. As shown in FIG. 12, the second conductive part 22 is provided with an opening 221. The orthogonal projection of the via hole connected between the first conductive part 11 and the fourth connection part 34 on the base substrate is within the orthogonal projection of the opening 221 on the base substrate, so as to avoid the via hole connected between the first conductive part 11 and the fourth connection part 34 from being electrically connected with the second conductive part 22. The fifth connection part 35 may connect the active layer between the sixth active part 56 and the seventh active part 57 through a via hole, to connect the second electrode of the sixth transistor T6. The sixth connection part 36 may connect the active layer on the side of the fourth active part 54 away from the ninth active part 59 through a via hole, to connect the first electrode of the fourth transistor T4. The seventh connection part 37 can connect the second conductive part 22 and the active layer on the side of the fifth active part 55 away from the third active part 53 through a via hole respectively, so as to connect the first electrode of the fifth transistor T5 and the second electrode of the capacitor.

As shown in FIGS. 9 and 14, the fourth conductive layer may include a data line Da, a power supply line VDD, and an eighth connection part 48. The data line Da may be used to provide the data signal terminal in FIG. 5, and the power supply line VDD may be used to provide the first power terminal in FIG. 5. The orthogonal projection of the data line Da on the base substrate and the orthogonal projection of the power supply line VDD on the base substrate may extend along the second direction Y. The data line Da may be connected to the sixth connection part 36 through the via hole H, to connect the first electrode of the fourth transistor T4 and the data signal terminal. The power supply line VDD can be connected to the seventh connection part 37 through a via hole, to connect the first power supply terminal with the first electrode of the fifth transistor and the second electrode of the capacitor C. The eighth connection part 48 may be connected to the fifth connection part 35 through a via hole, to connect the second electrode of the sixth transistor, and the eighth connection part 48 may be used to connect the first electrode of the light-emitting unit.

Figure 18:
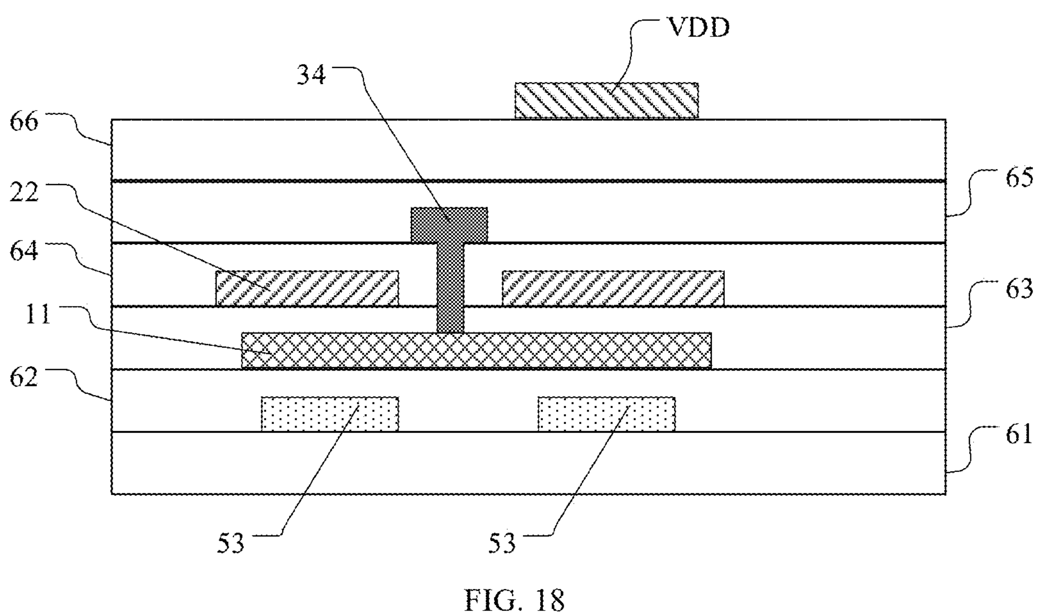
FIG. 18 is a partial cross-sectional view of the display panel along the dotted line CC shown in FIG. 9.

As shown in FIG. 18, it is a partial cross-sectional view of the display panel along the dotted line CC shown in FIG. 9. The display panel may further include a first insulating layer 62, a second insulating layer 63, a dielectric layer 64, a passivation layer 65 and a flat layer 66. The base substrate 61, the active layer, the first insulating layer 62, the first conductive layer, the second insulating layer 63, the second conductive layer, the dielectric layer 64, the third conductive layer, the passivation layer 65, the flat layer 66 and the fourth conductive layer are stacked sequentially. The first insulating layer 62 and the second insulating layer 63 may be silicon oxide layers. The dielectric layer 64 and the passivation layer 65 may be silicon nitride layers. The material of the flat layer 66 may be an organic material, such as polyimide (PI), polyethylene terephthalate (PET), polyethylene naphthalate (PEN), silicon-glass bonded structure (SOG) and other materials. The base substrate 61 may include a polyimide layer, and the materials of the first conductive layer and the second conductive layer may be one of molybdenum, aluminum, copper, titanium and niobium or an alloy thereof, or a molybdenum/titanium alloy or lamination, or the like. The materials of the third conductive layer and the fourth conductive layer may include metal materials, such as molybdenum, aluminum, copper, titanium and niobium or an alloy thereof, or a molybdenum/titanium alloy or lamination, or a titanium/aluminum/titanium lamination, or the like.

This example embodiment also provides a display device, wherein the display device includes the above display panel. The display device can be a mobile phone, a tablet computer, a television and other display devices.

Other embodiments of the present disclosure will be readily apparent to those skilled in the art from consideration of the specification and practice of the disclosure disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and embodiments are to be considered exemplary only, with the true scope and spirit of the disclosure indicated by the appended claims.

It should be understood that the present disclosure is not limited to the precise structure described above and shown in the drawings, and various modifications and changes can be made without departing from its scope. The scope of the present disclosure is limited only by the appended claims.

What is claimed is:

1. A display panel, comprising a pixel driving circuit for driving a light-emitting unit, the pixel driving circuit comprising:

a driving transistor;

a second transistor, having a first electrode connected to a gate of the driving transistor, a second electrode connected to a second electrode of the driving transistor, and a gate connected to a gate line;

a fourth transistor, having a first electrode connected to a data line, a second electrode connected to a first electrode of the driving transistor, and a gate connected to a second enable signal line;

a fifth transistor, having a first electrode connected to a power supply line, a second electrode connected to the first electrode of the driving transistor, and a gate connected to a first enable signal line;

a sixth transistor, having a first electrode connected to the second electrode of the driving transistor, a second electrode connected to a first electrode of the light-emitting unit, and a gate connected to the first enable signal line;

wherein the display panel further comprises:

a base substrate;

an active layer, located on a side of the base substrate, wherein the active layer comprises a second active part, a third active part, a fourth active part, a fifth active part and a sixth active part, the second active part is configured to form a channel region of the second transistor, the third active part is configured to form a channel region of the driving transistor, the fourth active part is configured to form a channel region of the fourth transistor, the fifth active part is configured to form a channel region of the fifth transistor, and the sixth active part is configured to form a channel region of the sixth transistor;

a first conductive layer, located on a side of the active layer away from the base substrate, wherein the first conductive layer comprises the first enable signal line, the second enable signal line, the gate line and a first conductive part, wherein an orthographic projection of the first conductive part on the base substrate covers an orthographic projection of the third active part on the base substrate, and the first conductive part is configured to form the gate of the driving transistor;

wherein an orthographic projection of the first enable signal line on the base substrate extends along a first direction and covers an orthographic projection of the fifth active part on the base substrate and an orthographic projection of the sixth active part on the base substrate, and a partial structure of the first enable signal line is configured to form the gate of the fifth transistor and the gate of the sixth transistor;

wherein an orthographic projection of the second enable signal line on the base substrate extends along the first direction and covers an orthographic projection of the fourth active part on the base substrate, and a partial structure of the second enable signal line is configured to form the gate of the fourth transistor;

wherein an orthographic projection of the gate line on the base substrate extends along the first direction and covers an orthographic projection of the second active part on the base substrate, and a partial structure of the gate line is configured to form the gate of the second transistor.

2. The display panel according to claim 1, wherein the pixel driving circuit further comprises:

a capacitor, connected between that power supply line and the gate of the driving transistor;

a first transistor, having a first electrode connected to a first initial signal line, a second electrode connected to the gate of the driving transistor, and a gate connected to a reset signal line;

a seventh transistor, having a first electrode connected to a second initial signal line, a second electrode connected to the first electrode of the light-emitting unit, and a gate connected to the second enable signal line;

wherein the driving transistor, the first transistor, the second transistor, the fourth transistor, the fifth transistor, the sixth transistor and the seventh transistor are P-type transistors;

wherein the active layer further comprises a first active part and a seventh active part, the first active part is configured to form a channel region of the first transistor, and the seventh active part is configured to form a channel region of the seventh transistor;

wherein the first conductive layer further comprises a reset signal line, an orthographic projection of the reset signal line on the base substrate extends along the first direction, the orthographic projection of the reset signal line on the base substrate covers an orthographic projection of the first active part on the base substrate, and a partial structure of the reset signal line is configured to form the gate of the first transistor;

wherein the orthographic projection of the second enable signal line on the base substrate further covers the seventh active part, and a partial structure of the second enable signal line is configured to form the gate of the seventh transistor;

wherein the display panel further comprises a second conductive layer, the second conductive layer is located on a side of the first conductive layer away from the base substrate, and the second conductive layer comprises:

a second conductive part, wherein an orthographic projection of the second conductive part on the base substrate at least partially overlaps with the orthographic projection of the first conductive part on the base substrate, the first conductive part is further configured to form a first electrode of the capacitor, and the second conductive part is further configured to form a second electrode of the capacitor;

wherein the orthographic projection of the gate line on the base substrate is located on a side of the orthographic projection of the first conductive part on the base substrate away from the orthographic projection of the first enable signal line on the base substrate;

wherein the orthographic projection of the reset signal line on the base substrate is located on a side of the orthographic projection of the gate line on the base substrate away from the orthographic projection of the first conductive part on the base substrate.

3. The display panel according to claim 2, wherein the active layer further comprises a tenth active part and an eleventh active part, the tenth active part is connected to an end of the first active part away from the second active part, and the eleventh active part is connected to an end of the seventh active part away from the sixth active part;

the second conductive layer further comprises:

the first initial signal line, wherein an orthographic projection of the first initial signal line on the base substrate extends along the first direction, and the orthographic projection of the first initial signal line on the base substrate is located on a side of the orthographic projection of the reset signal line on the base substrate away from the orthographic projection of the first conductive part on the base substrate;

the second initial signal line, wherein an orthographic projection of the second initial signal line on the base substrate extends along the first direction, and the orthographic projection of the second initial signal line on the base substrate is located on a side of the orthographic projection of the second enable signal line on the base substrate away from the orthographic projection of the first conductive part on the base substrate;

wherein the display panel further comprises a third conductive layer, the third conductive layer is located on a side of the second conductive layer away from the base substrate, and the third conductive layer comprises:

a second connection part, connecting the tenth active part and the first initial signal line through a via hole respectively;

a third connection part, connecting the second initial signal line and the eleventh active part through a via hole respectively, wherein the first direction is a row direction, and the display panel comprises a plurality of rows of pixel driving circuits, and an orthographic projection of the second initial signal line in the pixel driving circuit of a current row on the base substrate is located between an orthographic projection of the reset signal line in the pixel driving circuit of an adjacent next row on the base substrate and an orthographic projection of the gate line on the base substrate.

4. The display panel according to claim 2, wherein the first active part comprises a first active sub-part and a second active sub-part, and the active layer further comprises a third active sub-part connected between the first active sub-part and the second active sub-part;

an orthographic projection of the first initial signal line on the base substrate at least partially overlaps with an orthographic projection of the third active sub-part on the base substrate.

5. The display panel according to claim 2, wherein the second active part comprises a fourth active sub-part and a fifth active sub-part, and the active layer further comprises a sixth active sub-part connected between the fourth active sub-part and the fifth active sub-part;

wherein the second initial signal line comprises:

a main body line, wherein an orthogonal projection of the main body line on the base substrate extends along the first direction;

a first protrusion part, connected to the main body line, wherein an orthographic projection of the first protrusion part on the base substrate extends along a second direction, and the second direction intersects with the first direction;

wherein, an orthographic projection of the first protrusion part in the pixel driving circuit of a previous row on the base substrate at least partially overlaps with an orthographic projection of the sixth active sub-part in the pixel driving circuit of a current row on the base substrate.

6. The display panel according to claim 2, wherein the active layer further comprises a twelfth active part connected between the first active part and the second active part;

wherein the second initial signal line comprises:

a main body line, wherein an orthogonal projection of the main body line on the base substrate extends along the first direction;

a second protrusion part, connected to the main body line, and an orthographic projection of the second protrusion part on the base substrate extends along a second direction, and the second direction intersects with the first direction, wherein, an orthographic projection of the second protrusion part in the pixel driving circuit of a previous row on the base substrate at least partially overlaps with an orthographic projection of the twelfth active part in the pixel driving circuit of a current row on the base substrate, wherein the second initial signal line further comprises:

a third protrusion part, connected to the main body line, wherein an orthographic projection of the third protrusion part on the base substrate extends along the second direction, and the orthographic projection of the third protrusion part on the base substrate is located on a side of the orthographic projection of the main body line on the base substrate away from the orthographic projection of the second protrusion part on the base substrate;

wherein, an orthographic projection of the third protrusion part in the pixel driving circuit of a previous row on the base substrate at least partially overlaps with an orthographic projection of the twelfth active part in the pixel driving circuit of a current row on the base substrate.

7. The display panel according to claim 1, wherein the orthographic projection of the first enable signal line on the base substrate is located between the orthographic projection of the second enable signal line on the base substrate and the orthographic projection of the first conductive part on the base substrate;

wherein the active layer further comprises:

an eighth active part, connected between the third active part and the fifth active part;

a ninth active part, connected to the fourth active part, wherein an orthographic projection of the ninth active part on the base substrate is located between the orthographic projection of the first enable signal line on the base substrate and the orthographic projection of the second enable signal line on the base substrate;

wherein the display panel further comprises:

a third conductive layer, located on a side of the first conductive layer away from the base substrate, wherein the third conductive layer comprises a first connection part, and the first connection part connects the eighth active part and the ninth active part through a via hole respectively.

8. A pixel driving circuit, for driving a light-emitting unit, comprising:

a driving circuit, connected to a first node, a second node and a third node, configured to input a driving current to the third node through the second node according to a voltage signal of the first node;

a compensation circuit, connected to the first node, the third node and a gate driving signal terminal, configured to connect the first node and the third node in response to a signal of the gate driving signal terminal;

a control circuit, connected to the second node, a first power supply terminal, the third node, a first electrode of the light-emitting unit, and a first enable signal terminal, configured to connect the first power supply terminal and the second node in response to a signal of the first enable signal terminal, and configured to connect the third node and the first electrode of the light-emitting unit in response to the signal of the first enable signal terminal; and a data writing circuit, connected to the second node, a data signal terminal and a second enable signal terminal, configured to transmit a signal of the data signal terminal to the second node in response to a signal of the second enable signal terminal, wherein, during at least part of a period when the gate driving signal terminal outputs an invalid level, the first enable signal terminal alternately outputs a valid level and an invalid level, the second enable signal terminal alternately outputs a valid level and an invalid level, and a valid level period of the second enable signal terminal is within an invalid level period of the first enable signal terminal, and a valid level period of the first enable signal terminal is within an invalid level period of the second enable signal terminal.

9. The pixel driving circuit according to claim 8, further comprising:

a first reset circuit, connected to the first node, a first initial signal terminal and a reset signal terminal, configured to transmit a signal of the first initial signal terminal to the first node in response to a signal of the reset signal terminal;

a second reset circuit, connected to the first electrode of the light-emitting unit and a second initial signal terminal, configured to transmit a signal of the second initial signal terminal to the first electrode of the light-emitting unit in response to a control signal.

10. The pixel driving circuit according to claim 9, wherein the second reset circuit is further connected to the second enable signal terminal, and the second reset circuit is configured to transmit the signal of the second initial signal terminal to the first electrode of the light-emitting unit in response to the signal of the second enable signal terminal;

wherein the first reset circuit comprises:

a first transistor, having a first electrode connected to the first initial signal terminal, a second electrode connected to the first node, and a gate connected to the reset signal terminal;

wherein the second reset circuit comprises:

a seventh transistor, having a first electrode connected to the second initial signal terminal, a second electrode connected to the first electrode of the light-emitting unit, and a gate connected to the second enable signal terminal.

11. The pixel driving circuit according to claim 8, comprising:

a driving transistor, having a first electrode connected to the second node, a second electrode connected to the third node, and a gate connected to the first node.

12. The pixel driving circuit according to claim 8, wherein the compensation circuit comprises:

a second transistor, having a first electrode connected to the first node, a second electrode connected to the third node, and a gate connected to the gate driving signal terminal.

13. The pixel driving circuit according to claim 8, wherein the data writing circuit comprises:

a fourth transistor, having a first electrode connected to the data signal terminal, a second electrode connected to the second node, and a gate connected to the second enable signal terminal.

14. The pixel driving circuit according to claim 8, wherein the control circuit comprises:

a fifth transistor, having a first electrode connected to the first power supply terminal, a second electrode connected to the second node, and a gate connected to the first enable signal terminal;

a sixth transistor, having a first electrode connected to the third node, a second electrode connected to the first electrode of the light-emitting unit, and a gate connected to the first enable signal terminal.

15. The pixel driving circuit according to claim 8, wherein logic levels of the second enable signal terminal and the first enable signal terminal are opposite.

16. The pixel driving circuit according to claim 8, further comprising:

a storage circuit, connected between the first node and the first power supply terminal, wherein the storage circuit comprises:

a capacitor, connected between the first node and the first power supply terminal.

17. The pixel driving circuit according to claim 8, comprising:

a driving transistor, having a first electrode connected to the second node, a second electrode connected to the third node, and a gate connected to the first node;

wherein the compensation circuit comprises:

a second transistor, having a first electrode connected to the first node, a second electrode connected to the third node, and a gate connected to the gate driving signal terminal;

wherein the data writing circuit comprises:

a fourth transistor, having a first electrode connected to the data signal terminal, a second electrode connected to the second node, and a gate connected to the second enable signal terminal;

wherein the control circuit comprises:

a fifth transistor, having a first electrode connected to the first power supply terminal, a second electrode connected to the second node, and a gate connected to the first enable signal terminal;

a sixth transistor, having a first electrode connected to the third node, a second electrode connected to the first electrode of the light-emitting unit, and a gate connected to the first enable signal terminal;

wherein the pixel driving circuit further comprises a first reset circuit, a second reset circuit and a storage circuit;

wherein the first reset circuit comprises:

a first transistor, having a first electrode connected to a first initial signal terminal, a second electrode connected to the first node, and a gate connected to a reset signal terminal;

wherein the second reset circuit comprises:

a seventh transistor, having a first electrode connected to a second initial signal terminal, a second electrode connected to the first electrode of the light-emitting unit, and a gate connected to the second enable signal terminal;

wherein the storage circuit comprises:

a capacitor, connected between the first node and the first power supply terminal;

wherein, the driving transistor, the first transistor, the second transistor, the fourth transistor, the fifth transistor, the sixth transistor and the seventh transistor are P-type transistors.

18. A display panel, comprising the pixel driving circuit according to claim 8.

19. A driving method of a pixel driving circuit, for driving a pixel driving circuit, wherein the pixel driving circuit is configured to drive a light-emitting unit and comprises:

a driving circuit, connected to a first node, a second node and a third node, configured to input a driving current to the third node through the second node according to a voltage signal of the first node;

a compensation circuit, connected to the first node, the third node and a gate driving signal terminal, configured to connect the first node and the third node in response to a signal of the gate driving signal terminal;

a control circuit, connected to the second node, a first power supply terminal, the third node, a first electrode of the light-emitting unit, and a first enable signal terminal, configured to connect the first power supply terminal and the second node in response to a signal of the first enable signal terminal, and configured to connect the third node and the first electrode of the light-emitting unit in response to the signal of the first enable signal terminal; and a data writing circuit, connected to the second node, a data signal terminal and a second enable signal terminal, configured to transmit a signal of the data signal terminal to the second node in response to a signal of the second enable signal terminal, wherein, during at least part of a period when the gate driving signal terminal outputs an invalid level, the first enable signal terminal alternately outputs a valid level and an invalid level, the second enable signal terminal alternately outputs a valid level and an invalid level, and a valid level period of the second enable signal terminal is within an invalid level period of the first enable signal terminal, and a valid level period of the first enable signal terminal is within an invalid level period of the second enable signal terminal, wherein the driving method comprises:

in a first sub-stage of a first stage, the gate driving signal terminal and the second enable signal terminal outputting a valid level, and the first enable signal terminal outputting an invalid level;

in a second sub-stage of the first stage, the first enable signal terminal outputting a valid level, and the second enable signal terminal and the gate driving signal terminal outputting an invalid level;

in a second stage, the gate driving signal terminal outputting an invalid level, the first enable signal terminal alternately outputting a valid level and an invalid level, and the second enable signal terminal alternately outputting a valid level and an invalid level, wherein, a valid level period of the second enable signal terminal is within an invalid level period of the first enable signal terminal, and a valid level period of the first enable signal terminal is within an invalid level period of the second enable signal terminal, and in the second stage, a level written to the second node by the data signal terminal is at least partially different from a voltage of the first power supply terminal.

20. The driving method of the pixel driving circuit according to claim 19, wherein the pixel driving circuit is applied to a display panel, and one frame period of the display panel comprises a picture updating period and a picture holding period;

in one frame period, first stages of all pixel driving circuits in the display panel are within the picture updating period, and second stages of all pixel driving circuits in the display panel are within the picture holding period.

* * * * *